(12) United States Patent
Hirashima et al.

(10) Patent No.: US 6,400,019 B1
(45) Date of Patent: Jun. 4, 2002

(54) SEMICONDUCTOR DEVICE WITH WIRING SUBSTRATE

(75) Inventors: Toshinori Hirashima; Yasushi Takahashi, both of Takasaki; Kenji Hanada; Takao Sonobe, both of Komoro, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/708,597

(22) Filed: Nov. 9, 2000

(30) Foreign Application Priority Data

Nov. 25, 1999 (JP) .......................... 11-334167
Mar. 17, 2000 (JP) .......................... 12-075768

(51) Int. Cl.[7] ............................................. H01L 23/48
(52) U.S. Cl. ..................................... 257/737; 257/778
(58) Field of Search ................................ 257/737, 786, 257/778

(56) References Cited

U.S. PATENT DOCUMENTS 5,859,474 A * 1/1999 Dordi .......................... 257/737

FOREIGN PATENT DOCUMENTS

| JP | 7-22538 | 1/1995 |
| JP | 7-193162 | 7/1995 |
| JP | 9-307022 | 11/1997 |
| JP | 11-154718 | 6/1999 |

OTHER PUBLICATIONS

"The Next Generation of LSI Packaging Technology," Nikkei Microdevices, Kabushiki Gaisha Nikkei BP, Feb. 1, 1998, pp. 48–55 (with translation).

"The Next Generation of LSI Packaging Technology," Nikkei Microdevices, Kabushiki Gaisha Nikkei BP, Feb. 1, 1998, pp. 48–55 (with translation).

* cited by examiner

*Primary Examiner*—Roy Potter
(74) *Attorney, Agent, or Firm*—Mattingly, Stanger & Malur, P.C.

(57) ABSTRACT

The junction strength between the external terminals and the wiring substrate of a semiconductor device is improved without creating a large size semiconductor device. In the outer periphery of the back surface of an interposer substrate 1Bi on which a semiconductor chip constructing a CSP type semiconductor device 1 is mounted, there are arranged a plurality of bump electrodes 1BB1 whose size in the direction intersecting the sides of the interposer substrate 1B1 is larger than that in the direction along the sides of the interposer substrate 1Bi.

8 Claims, 17 Drawing Sheets

1: SEMICONDUCTOR DEVICE
1Bi: INTERPOSER SUBSTRATE
1BB1: BUMP ELECTRODES (EXTERNAL TERMINALS)
1BB2: BUMP ELECTRODES

SEMICONDUCTOR DEVICE WITH WIRING SUBSTRATE

BACKGROUND OF THE INVENTION

The present invention relates to a semiconductor device technique and, more particularly, to a technique effective when applied to a semiconductor device technique having a high-frequency signal processing circuit.

As a small-sized electronic device such as a mobile telephone or a portable computer comes into wide use, it has been promoted to reduce the size and thickness of a semiconductor device constituting the electronic device. The BGA (Ball Grid Array), the LGA (Land Grid Array) or the CSP (Chip Size Package) is a package structure for promoting the reduction in the size and thickness, for which various devices have been made. For example, the CSP is the general naming of the package which is equivalent or slightly larger than the size of the semiconductor chip, and can realize the size thickness reduction and shorten the internal wiring length so that it has been practiced as the package structure for reducing the signal delay or noise.

In the package structure for realizing the size thickness reductions, however, there are problems of: the difficulty in damping the stress because the connections between the semiconductor device and the wiring substrate for mounting the semiconductor device are comprised of bump electrodes and fixed; and a low junction strength because the bump electrodes have small contact areas. These problems have been described on pp. 48 to 55 of "Nikkei Microdevice, February, 1998", as issued by Kabushiki Gaisha Nikkei BP on Feb. 1, 1998, which has disclosed the optimization of the contact areas and the materials of the bump electrodes.

SUMMARY OF THE INVENTION

In the technique for optimizing the contact area of the bump electrodes so as to improve the junction strength, however, the adjoining spacing between the bump electrodes is widened to enlarge the area (i.e., the contact area) . Therefore, we have found that there arises a problem contrary to the size reduction of the semiconductor device.

On the other hand, we have searched the examples of the prior art from the standpoint of the junction strength of the bump electrodes on the basis of the invention, and have found out Unexamined Published Japanese Patent Applications Nos. 7-22538 and 7-193162. In these Publications, there is disclosed a technique by which larger bump electrodes and smaller bump electrodes are arranged on the back surface of a package substrate, but the larger bump electrodes enlarge the diameter.

In Unexamined Published Japanese Patent Application No. 9-307022, on the other hand, there is disclosed a structure in which the diameter of solder balls in the outer periphery of a solder ball arranging area on the back surface of a package substrate is made larger than that of the remaining solder balls so as to prevent the fatigue failures of the solder balls, as might otherwise be caused by the stress between the package substrate and the printed-circuit board.

In Unexamined Published Japanese Patent Application No. 11-154718, on the other hand, there is disclosed a structure in which the diameter of the solder joint portions near the corners of a semiconductor chip is made larger than that of the remaining solder joint portions so as to prevent the fatigue failures of the solder joint portions, as might otherwise be caused by the stress between the ceramic substrate and the printed board.

An object of the invention is to provide a technique for improving the junction strength between the external terminals and the wiring substrate of a semiconductor device without increasing the top plan size of the semiconductor device.

The aforementioned and other objects and novel features of the invention will become apparent from the following description to be made with reference to the accompanying drawings.

The representatives of the invention to be disclosed herein will be summarized in the following.

According to the invention, specifically, a plurality of external terminals having different top plan sizes in the longitudinal and transverse directions are arranged in the outer periphery of the back surface of a wiring substrate for mounting a semiconductor chip.

According to the invention, on the other hand, a plurality of external terminals, the top plan size of which is larger in the direction to intersect the sides of a wiring substrate for mounting a semiconductor chip is larger than the top plan size in the direction in parallel with the sides, are arranged in the outermost periphery of the back surface of the wiring substrate.

According to the invention, on the other hand, a plurality of rectangular external terminals having rounded corners are arranged in the outermost periphery of the back surface of a wiring substrate for mounting a semiconductor chip.

DESCRIPTION OF THE PREFERRED EMBODIMENTS

Figure 1:
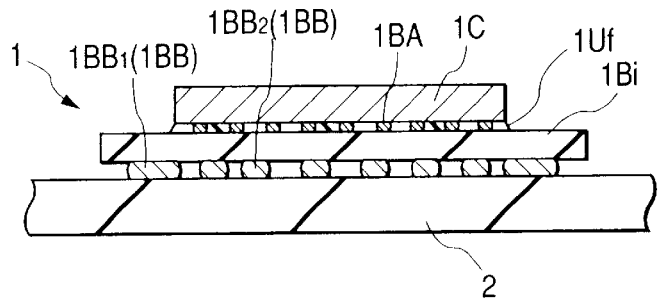
FIG. 1 is a sectional view of a semiconductor device according to one embodiment of the invention.

The invention will be described in detail in connection with its embodiments with reference to the accompanying drawings. Here, portions having identical functions are designated by the common reference numerals throughout the drawings for explaining the embodiments, and their repeated descriptions will be omitted.

On the other hand, the following embodiments will be described separately on a plurality of sections or modes, if necessary for conveniences, but they are not unrelated to one another unless otherwise explicitly specified so. One embodiment is related partially or wholly to the modification or the detailed or supplementary description of another.

When a reference is made in the following embodiments to the number of components (including the number, numerical value, quantity or range), the embodiments should not be limited to the specified number unless otherwise explicitly specified or apparently limited thereto on principle, but may be over or under that number.

(Embodiment 1)

Figure 2:
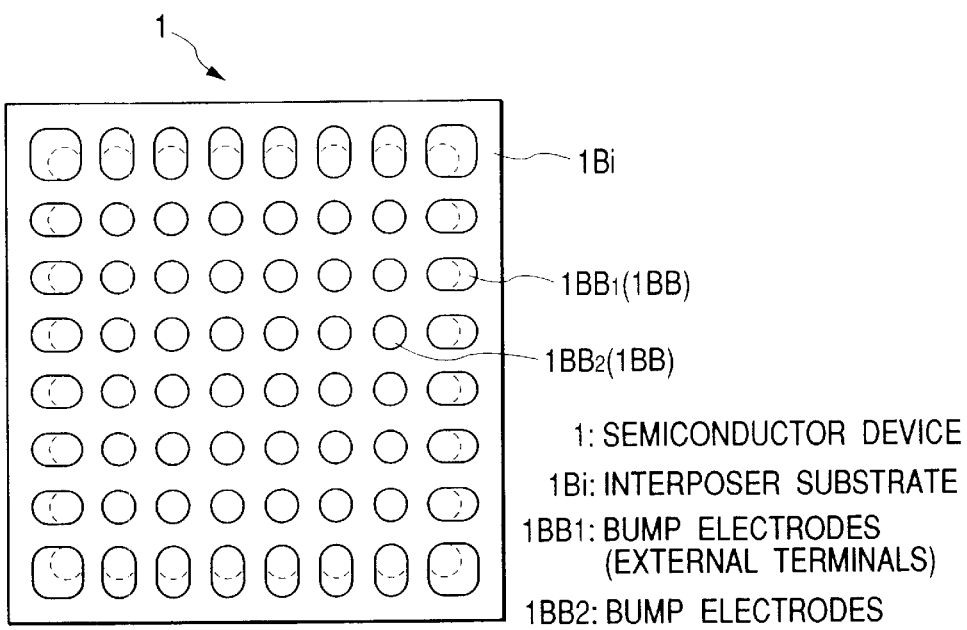
FIG. 2 is a top plan view of the back surface of a wiring substrate of the semiconductor device of FIG. 1.
Figure 3:
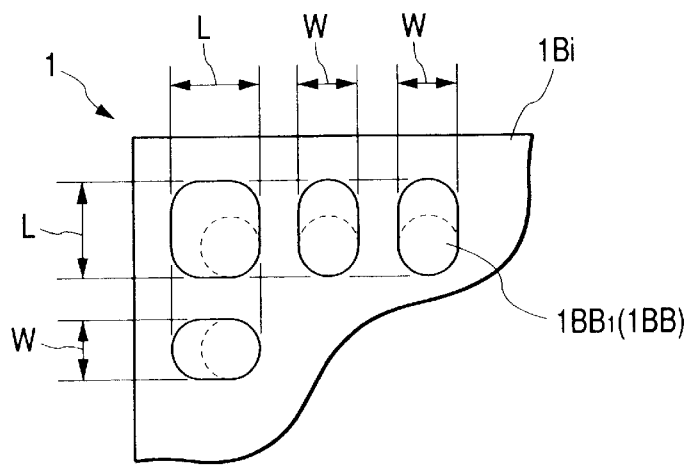
FIG. 3 is an enlarged top plan view of an essential portion of FIG. 2.

A semiconductor device of Embodiment 1 is of the CSP (Chip Size Package) type to be used as a mobile telephone or a portable personal computer. FIG. 1 is a sectional view of the state in which the semiconductor device 1 is mounted on a wiring substrate 2; FIG. 2 is a top plan view of the back surface of an interposer substrate 1Bi constituting the semiconductor device 1; and FIG. 3 is an enlarged top plan view of an essential portion of FIG. 2. Here in FIGS. 2 and 3, broken lines show the bump electrodes of the outermost periphery and the inside bump electrodes by assuming the case in which the inside bump electrodes are arranged at the positions of the bump electrodes of the outermost periphery, so as to clarify the difference in their sizes.

The semiconductor chip 1C constituting the semiconductor device 1 is made of a small chip of a semiconductor substrate of a square shape composed mainly of a single crystal of silicon, for example. The semiconductor chip 1C has a thickness of about 0.4 mm, although not especially limitative thereto. On the main surface of the semiconductor chip 1C, there is formed a high-frequency analog signal circuit, for example. Here, the high frequency is defined to be no less than 1 GHz, for example.

The electrodes of this high-frequency analog signal circuit are led out as bump electrodes (or connections) 1BA which are regularly arranged on the main surface of the semiconductor chip 1C. Moreover, the semiconductor chip 1C is so mounted on the main surface of the interposer substrate (or wiring substrate) 1Bi that its main surface confronts the interposer substrate 1Bi while interposing the bump electrodes 1BA inbetween. These bump electrodes 1BA are made of a lead-tin alloy or gold having a height of about 0.05 mm, for example, and connect the aforementioned circuit of the semiconductor chip 1C and the wiring lines of the interposer substrate 1Bi electrically therethrough. The clearance between the confronting faces of the semiconductor chip 1C and the interposer substrate 1Bi is filled with an under-fill 1UF made of an epoxy resin, for example, to seal up the main surface (and a portion of the side faces) of the semiconductor chip 1C.

The interposer substrate 1Bi has a function to take a registration in size between the arrangement of the bump electrodes 1BA of the semiconductor chip 1C and the arrangement of the electrodes of the wiring substrate 2 and to connect the circuit of the semiconductor chip 1C and the wiring lines of the wiring substrate 2 electrically. The interposer substrate 1Bi has a base made of ceramics, a glass epoxy resin or a polyimide resin to have a thickness of about 0.4 mm, for example. On the main surface, inside and the back surface of the interposer substrate 1Bi, there are formed wiring lines which are made of a refractory metal such as tungsten. The wiring lines (including lands), as formed on the main surface (for mounting the semiconductor chip 1C) of the interposer substrate 1Bi, are electrically connected with the wiring lines (including lands) of the back surface through the internal wiring lines formed in the base. On the back surface of the interposer substrate 1Bi, there are arranged sixty four bump electrodes (or external terminals) 1BB (1BB1, 1BB2) which are regularly arrayed in a matrix shape all over the surface. Moreover, the semiconductor device 1 is so mounted on the wiring substrate 2 through the bump electrodes 1BB that the back surface of the interposer substrate 1Bi confronts the wiring substrate 2. The bump electrodes 1BB are made of a lead-tin alloy, for example, and they connect the wiring lines of the semiconductor device 1 and the wiring substrate 2 electrically therethrough. Here, the wiring substrate 2 is prepared by forming wiring lines of a metal such as copper on the main surface, inside and on the back surface of the base made of a glass epoxy resin and having a thickness of about 0.6 mm.

Of the bump electrodes 1BB on the back surface of the interposer substrate 1Bi, the bump electrodes (or the first external terminals) 1BB1 on the outermost periphery act as electrodes for high-frequency analog signals, for example. With a high inductance component of the path of the wiring lines for transmitting a high-frequency signal, more specifically, there occur problems such as a signal propagation delay or a crosstalk noise. In order to reduce that inductance component, therefore, it is preferable to shorten the wiring distance between the semiconductor device 1 and another element (such as a resistor, a capacitor or another semiconductor device). On the other hand, the outermost peripheral bump electrodes 1BB1 of the interposer substrate 1Bi are made of a micro-strip so that they are easy to match the impedances. In the semiconductor device 1, therefore, the bump electrodes 1BB for the high-frequency signal are preferably arranged as many as possible in the outermost periphery of the interposer substrate 1Bi.

In Embodiment 1, therefore, by using the outermost periphery bump electrodes 1BB1 of the interposer substrate 1Bi as the high-frequency signal electrodes, the path of the wiring lines for connecting the high-frequency analog signals of the semiconductor device 1 and another circuit element (e.g., a resistor, a capacitor or another semiconductor device) on the wiring substrate 2 can be shortened to reduce the inductance component of the wiring path. As a result, it is also possible to facilitate the design of the entire circuit to be formed over the wiring substrate 2. Of the bump electrodes 1BB of the back surface of the interposer substrate 1Bi, the bump electrodes (or fourth external terminals) 1BB2 are employed as an electrode for a higher power source, an electrode for a lower potential and an electrode for a control signal. Of the bump electrodes 1BB1, on the other hand, the bump electrodes 1BB1 near the corners of the interposer substrate 1Bi may be employed as the dummy electrodes which are not electrically connected with the circuit of the semiconductor chip 1C.

Here in Embodiment 1, of the bump electrodes 1BB of the back surface of the interposer substrate 1Bi, the top plan size of the bump electrodes 1BB1 arranged in the outermost periphery is larger than that of the bump electrodes 1BB2 arranged inside of the former. However, the top plan size of the bump electrodes 1BB1 is not only relatively enlarged. Of the longitudinal/transverse top plan sizes, moreover, the top plan size in the direction for the bump electrodes 1BB1 to intersect the sides of the interposer substrate 1Bi (i.e., in the longitudinal direction to intersect the direction for the bump electrodes 1BB1 to adjoin) is larger than that in the direction in parallel with the sides of the interposer substrate 1Bi (i.e., in the transverse direction for the bump electrodes 1BB1 to adjoin).

Specifically, the portions of the outermost periphery bump electrodes 1BB1 on the back surface of the interposer substrate 1Bi are subjected by a bend or impact to a stress such as the most deformation so that they have to be improved in the junction strength. If, however, the outermost periphery bump electrodes 1BB1 are merely enlarged uniformly in their top plan size (i.e., relatively in their diameters) so as to improve the junction strength, the adjoining spacing of the outermost periphery bump electrodes 1BB1 has to be enlarged to increase the area of the semiconductor device 1 drastically. This increase raises a problem especially in case the high-frequency signal bump electrodes 1BB1 have to be arranged as many as possible on the outermost periphery of the back surface of the interposer substrate 1Bi, as described above.

In Embodiment 1, therefore, the top plan size of the bump electrodes 1BB in the direction to intersect the sides of the interposer substrate 1Bi (i.e., the longitudinal size) is made larger than that in the direction in parallel with the sides of the interposer substrate 1Bi (i.e., the transverse size) so that the contact area (i.e., the area to contact with the wiring substrate 2) can be enlarged while leaving the adjoining spacing of the bump electrodes 1BB narrow). Without inviting an increase the top plan size of the semiconductor device 1 (or while leaving the semiconductor device 1 in a small size), therefore, the junction strength between the semiconductor device 1 and the wiring substrate 2 can be improved to reduce the percentage of defectives or breakages, as caused by the bend or shock. Especially in the mobile telephone, it is advantageous that the wiring substrate is strong against the bending test, when the CSP is arranged on the back surface of the push buttons. Embodiment 1 is strong against the bending test so that it can improve the production yield and the reliability of an electronic device such as the mobile telephone.

Even of the outermost periphery bump electrodes 1BB1 on the back surface of the interposer substrate 1Bi, however, the bump electrodes 1BB1 (or second external terminals), as arranged near the corners of the back surface of the interposer substrate 1Bi, are made larger than the remaining bump electrodes 1BB1 and given an equal aspect ratio. This is partly because the construction does not invite any increase in the adjoining spacing of the bump electrodes 1BB1 and partly because the locations are the farthest from the center of the interposer substrate 1Bi so that the junction strength of the bump electrodes 1BB1 is preferably improved by increasing the contact area. On the other hand, the bump electrodes 1BB2 are formed into a circular shape, for example, in the top plan view.

The interposer substrate 1Bi has a top plan size of about 5×5 mm, for example, although not especially limitative thereto. The bump electrodes 1BB1 have an adjoining spacing (i.e., the distance from the center to the center of the adjoining bump electrodes 1BB1, as called the "pitch") of about 0.5 mm, for example. On the other hand, the bump electrodes 1BB2 have an adjoining spacing (i.e., the distance from the center to the center of the adjoining bump electrodes 1BB2, as called the "pitch") of about 0.5 mm, for example. On the other hand, the bump electrodes 1BB1 and 1BB2 have a height of about 0.1 to 0.15 mm, for example. Of the top plan size of the bump electrodes 1BB1 other than those near the corners, the longitudinal size L is exemplified by 0.45 to 0.6 mm, and the transverse size W is exemplified by about 0.3 mm. On the other hand, the bump electrodes 1BB1 near the corners have a top plan size (i.e., the size L×the size W) of about 0.45×0.45 mm, for example. On the other hand, the bump electrodes 1BB2 have a diameter of about 0.3 mm, for example.

(Embodiment 2)

Figure 4:
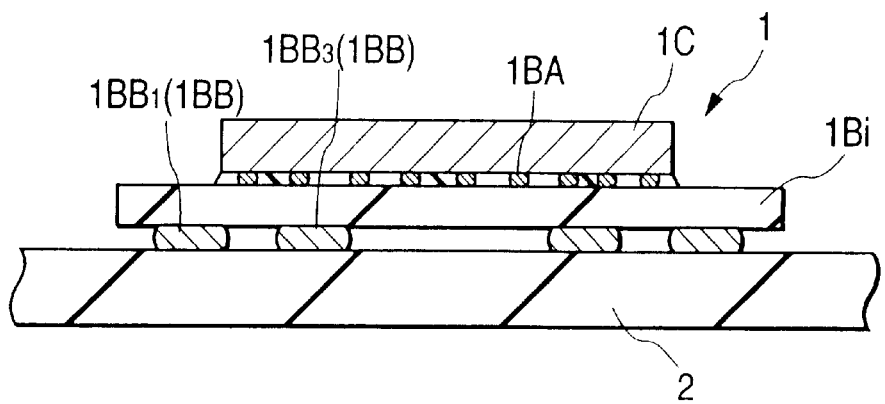
FIG. 4 is a sectional view of a semiconductor device according to another embodiment of the invention.
Figure 5:
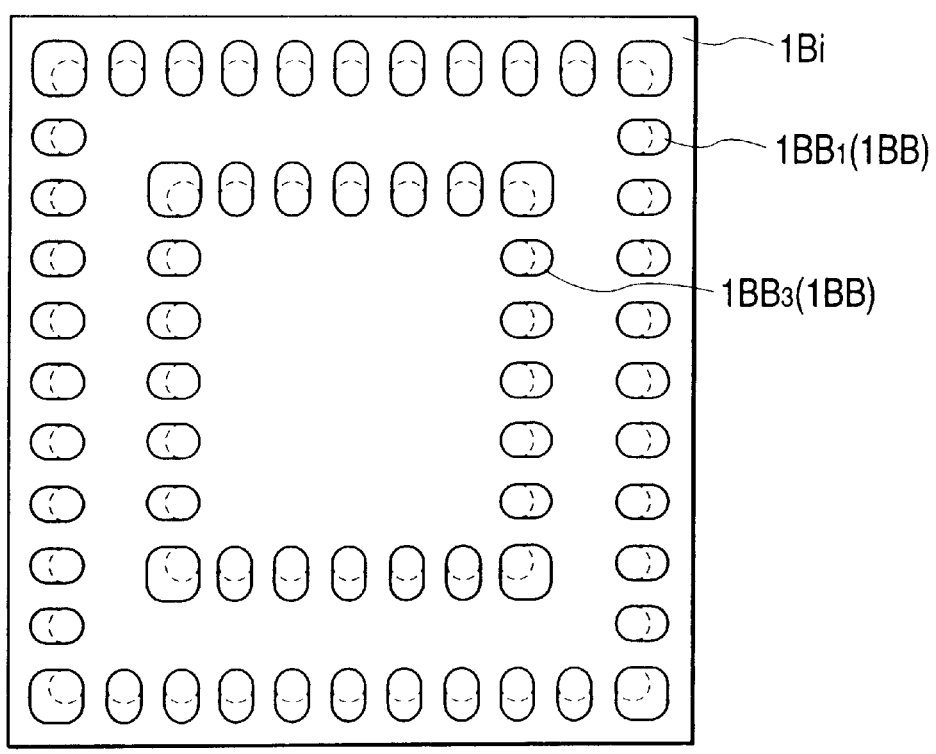
FIG. 5 is a top plan view of the back surface of a wiring substrate of the semiconductor device of FIG. 4.

FIG. 4 is a sectional view of a semiconductor device according to another embodiment of the invention, and FIG. 5 is a top plan view of the back surface of an interposer substrate 1Bi constituting the semiconductor device of FIG. 4. Here, the broken lines of FIG. 5 have the same indication as that which has been described in connection with Embodiment 1 with reference to FIG. 2.

In Embodiment 2, as shown in FIGS. 4 and 5, the bump electrodes 1BB on the back surface of the interposer substrate 1Bi are doubly arranged, and their inner bump electrodes (or first external terminals) 1BB3 are made like the bump electrodes 1BB1 such that the size in the direction to intersect the sides of the interposer substrate 1Bi is longer than the size in the direction parallel to the sides of the interposer substrate 1Bi. As a result, the junction strength of the bump electrodes 1BB can be improved more than that of the case of Embodiment 1 without inviting the increase in the top plan size of the interposer substrate 1Bi. Here, the interposer substrate 1Bi has a top plan size of about 6×6 mm, for example, although not especially limitative thereto. The number of the bump electrodes 1BB is exemplified by sixty four. On the other hand, the top plan size of each of the bump electrodes 1BB3 is identical to that of the bump electrodes 1BB1.

(Embodiment 3)

Figure 6:
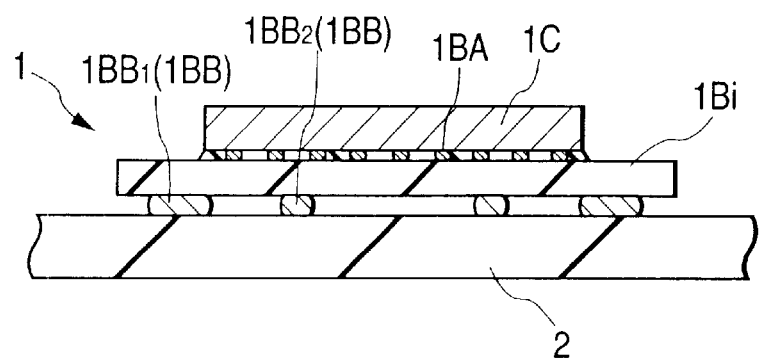
FIG. 6 is a sectional view of a semiconductor device according to still another embodiment of the invention.
Figure 7:
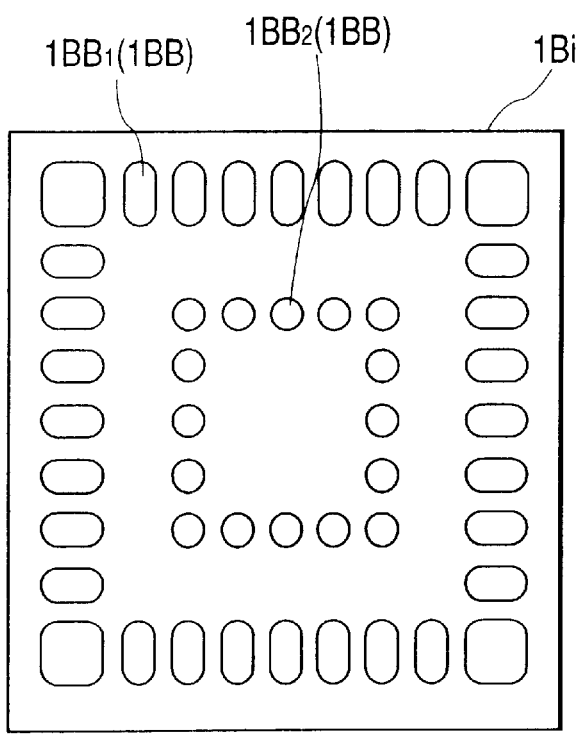
FIG. 7 is a top plan view of the back surface of a wiring substrate of the semiconductor device of FIG. 8.

FIG. 6 is a sectional view of a semiconductor device according to another embodiment of the invention, and FIG. 7 is a top plan view of the back surface of the interposer substrate 1Bi constituting the semiconductor device of FIG. 6.

In Embodiment 3, as shown in FIGS. 6 and 7, the bump electrodes 1BB on the back surface of the interposer substrate 1Bi are doubly arranged. Of these bump electrodes 1BB, the outer bump electrodes 1BB1 made as in Embodiments 1 and 2 such that the size in the direction to intersect the sides of the interposer substrate 1Bi is longer than the size in the direction parallel with the sides of the interposer substrate 1Bi, but the inner bump electrodes 1BB2 are made to have the ordinary top plan shape of a circle. Here, the interposer substrate 1Bi has a top plan size of abut 5×5 mm, for example, although not especially limitative thereto. The number of bump electrodes 1BB is forty eight, for example. On the other hand, the top plan size of each of the bump electrodes 1BB1 and 1BB2 is equal to that of Embodiment 1.

(Embodiment 4)

A semiconductor device of Embodiment 4 is of the same CSP type at that of the semiconductor devices of Embodiments 1 to 3. Especially, the semiconductor device of Embodiment 4 has a structure substantially identical to that of the semiconductor device described in connection with Embodiment 2. What is different resides in the structure for strengthening the power source of the semiconductor device. Here, the sizes of the same components as those of Embodiments 1 to 3 are equal to those described in connection with Embodiments 1 to 3, unless otherwise specified.

Figure 8:
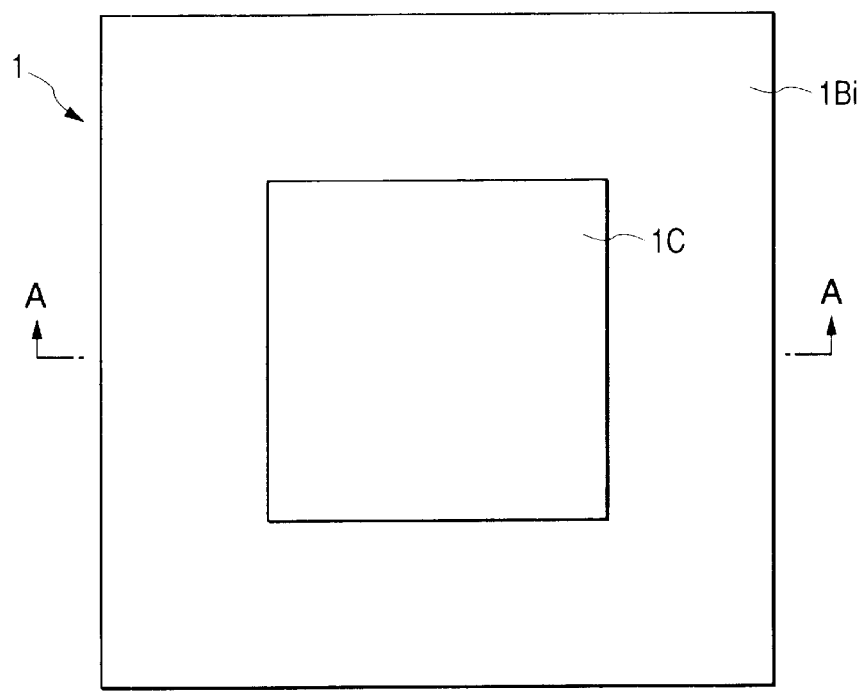
FIG. 8 is a top plan view showing the main surface of a semiconductor device according to a further embodiment of the invention.
Figure 9:
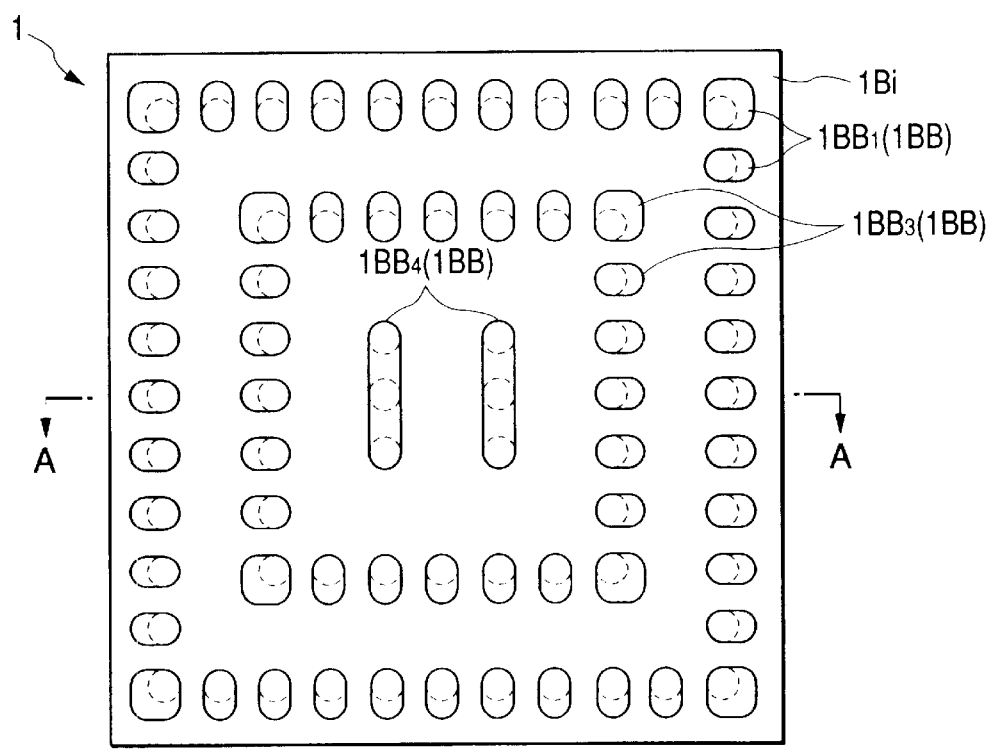
FIG. 9 is a top plan view of the back surface of a wiring substrate of the semiconductor device of FIG. 8.

First of all, here will be described the power source strengthening structure. FIGS. 8 and 9 show the main surface and the back surface of the semiconductor device 1 of Embodiment 4, respectively. Here, the broken lines of FIG. 9 have the same indication as that which has been described in connection with Embodiments 1 and 2 with reference to FIGS. 2 and 5.

In Embodiment 4, for example, two bump electrodes (or third external terminals) 1BB4 are arranged in parallel with each other on the back surface (i.e., the face confronting the wiring substrate 2 for mounting the semiconductor device 1) of the semiconductor device 1, that is, at the center (i.e., the region enclosed planarly by the plurality of bump electrodes 1BB3) of the back surface of the interposer substrate 1Bi. Those bump electrodes 1BB4 are electrodes for feeding a relatively high power potential (e.g., 1.8 V to 3.3 V) or a relatively low power potential (as generally as the GND potential or the ground potential at 0 V)to the semiconductor device 1 from the outside. Here, the bump electrodes 1BB4 are formed to have a larger area than that of the remaining bump electrodes 1BB1 and 1BB3. Specifically, the bump electrodes 1BB4 have a transverse size equal to that of the other bump electrodes 1BB1 and 1BB3 but such a longitudinal size larger than that of the other bump electrodes 1BB1 and 1BB3 as can arrange the three ordinary bump electrodes 1BB2, for example, while retaining their adjoining spacing (or pitch), as indicated by broken lines. As a result, the impedance of the power lines at the lower or higher potential can be lowered to feed the power voltage at the higher or lower potential stably to the semiconductor device 1. On the other hand, the transverse size of the bump electrodes 1BB4 is equal to hat of the other bump electrodes 1BB1 and 1BB3 so that the provision of the bump electrodes 1BB4 will not increase the top plan size of the semiconductor device 1 drastically. Therefore, the power source of the semiconductor device 1 can be strengthened without inviting an increase in the size of the semiconductor device 1. Here, the bump electrodes 1BB4 have a height equal to that of the foregoing bump electrodes 1BB1 to 1BB3.

In Embodiment 4, however, the bump electrodes 1BB1 and 1BB3 have larger areas than those of the ordinary bump electrodes having the circular top plan shape, as described hereinbefore. In place of or in combination of the aforementioned structures, therefore, the power source can also be sufficiently strengthened by assigning the bump electrodes for the higher or lower potential to either the bump electrodes 1BB1 or 1BB3 and by arranging them discretely in the back surface of the interposer substrate 1Bi.

Figure 10:
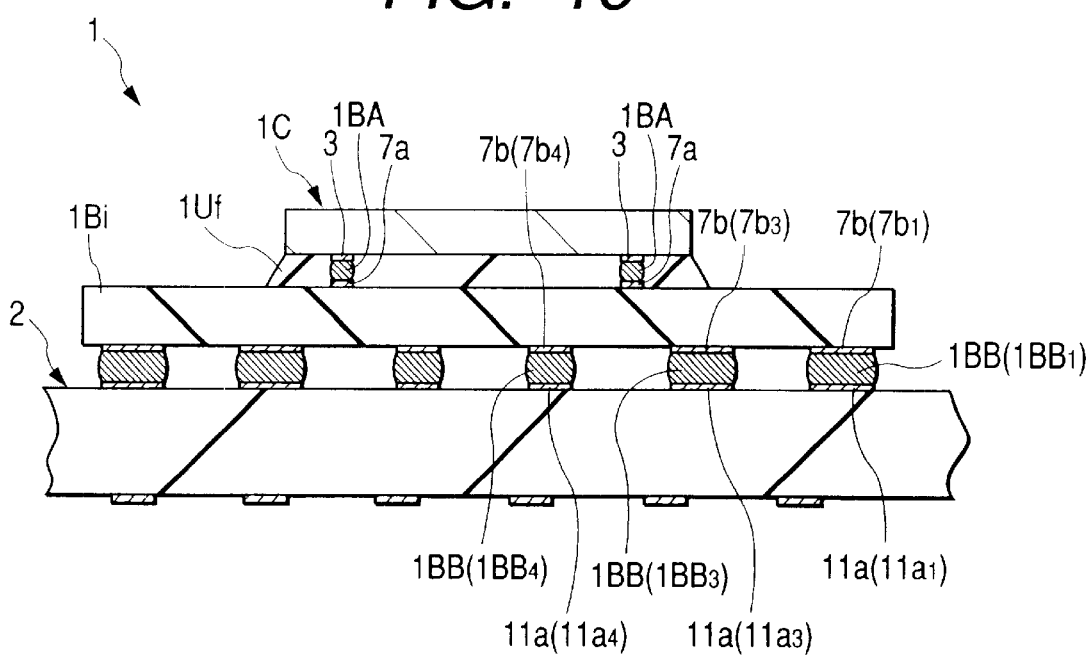
FIG. 10 is a sectional view showing the mounted state of the semiconductor device of FIGS. 8 and 9.

Here will be made a detailed description of the construction of the semiconductor device 1 of Embodiment 4 together with a more detailed description of the same construction as those of Embodiments 1 to 3. These descriptions will be made with reference to FIGS. 11 to 16 while stressing FIG. 10. Here, FIG. 10 is a sectional view of a portion, as taken along line A—A of FIGS. 8 and 9, when the semiconductor device 1 is mounted on the wiring substrate 2.

First of all, here will be described the semiconductor chip 1C. As shown in FIG. 10, the semiconductor chip 1C is mounted, as in Embodiments 1 to 3, on the main surface of the interposer substrate 1Bi through the bump electrodes 1BA. These bump electrodes 1BA are so jointed at their soldered portions that they contact directly with primary metal films 3 of the semiconductor chip 1C.

Figure 11A:
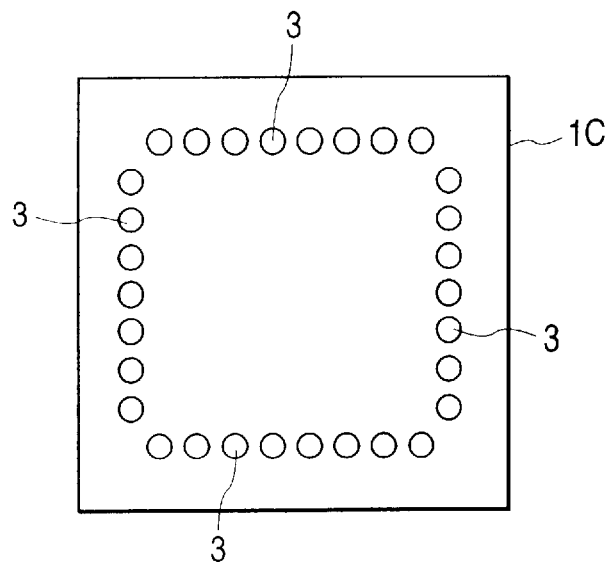
FIG. 11(A) is a top plan view of the main surface of a semiconductor chip constituting a semiconductor device according to the embodiment or another of the invention.
Figure 11B:
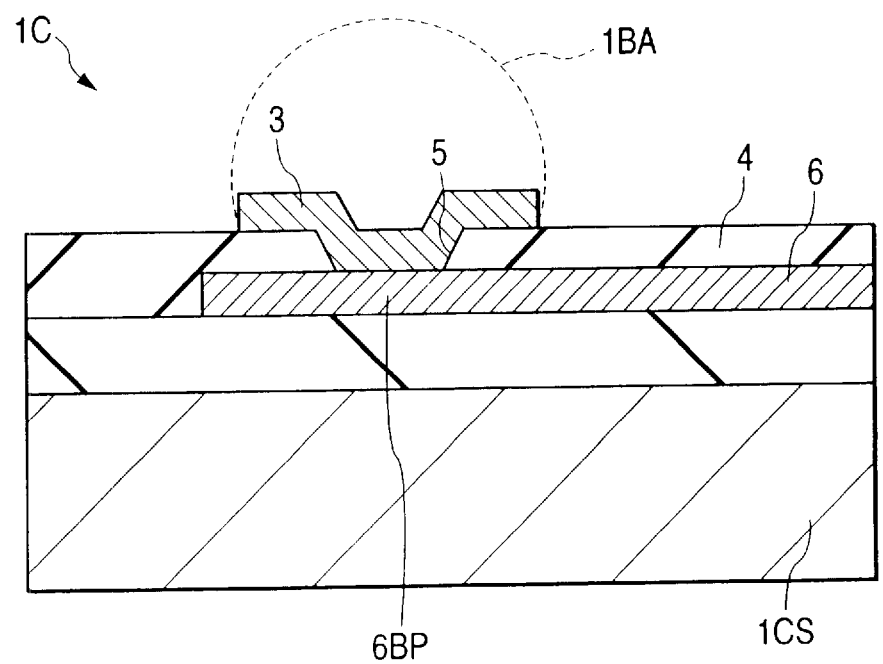
FIG. 11(B) is a sectional view of an essential portion of FIG. 11(A)

FIGS. 11(A) and 11(B) present the arrangement and section of the primary metal films 3 of the main surface of the semiconductor chip 1C, respectively. The primary metal films 3 are arranged in plurality, as shown planarly in FIG. 11(A), at a predetermined interval near and along the outer periphery of the main surface of the semiconductor chip 1C. However, the arrangement of the primary metal films 3 should not be limited thereto but could be modified in various manners such that the primary metal films 3 are paved in plurality at a predetermined spacing from each other over the whole main surface of the semiconductor chip 1C. Each of the primary metal films 3 is formed into a circle, for example, in a top plan view and has a diameter of about 50 microns, for example.

On the other hand, the primary metal films 3 are formed, as sectionally shown in FIG. 11(B), over a surface protecting film 4 of the semiconductor chip 1C. The primary metal films 3 are constituted by depositing a chromium (Cr) film, a copper (Cu) film and a nickel (Ni) film sequentially in the recited order from the lower layer of FIG. 11(B), although not especially limitative thereto. In short, the soldered portions of the bump electrodes 1BA are jointed to the primary metal films 3 on the side of the nickel film.

The surface protecting film 4 is exemplified by: a single film of silicon oxide ($SiO_2$); a laminated film prepared by laminating a silicon nitride film ($Si_3N_4$) over a silicon oxide film; or a laminated film prepared by laminating a polyimide resin film over a silicon oxide film through a silicon nitride film. In a portion of the surface protecting film 4, there is formed an opening 5, through which a pad 6BP is exposed to the outside. The primary metal films 3 are electrically connected with that opening 5 with the pad 6BP.

This pad 6BP is patterned integrally with a wiring line 6 in the uppermost wiring layer of the semiconductor chip 1C. The pad 6BP and the wiring line 6 are made of aluminum or its alloy, for example, and are electrically connected with a predetermined element (e.g., a MOS.FET (Metal Oxide Semiconductor), a diode, a bipolar transistor, a resistor or a capacitor) for the aforementioned high-frequency analog signal circuit. These predetermined elements are formed over the main surface of a semiconductor substrate 1Cs. This semiconductor substrate 1Cs forms an essential construction portion of the semiconductor chip 1C and is made of single crystal of silicon, for example.

Here will be described the interposer substrate 1Bi. On the main surface and the back surface of the interposer substrate 1Bi, as shown in FIG. 10, there are formed lands 7a and 7b. These lands 7a and 7b form a part of the wiring lines of the interposer substrate 1Bi. To the lands 7a on the main surface, there are jointed the soldered portions of the bump electrodes 1BA of the semiconductor chip 1C in the direct contact state. To the lands (or a plurality of external terminals) 7b on the back surface, on the other hand, there are jointed the soldered portions of the bump electrodes 1BB in the direct contact state.

Figure 12A:
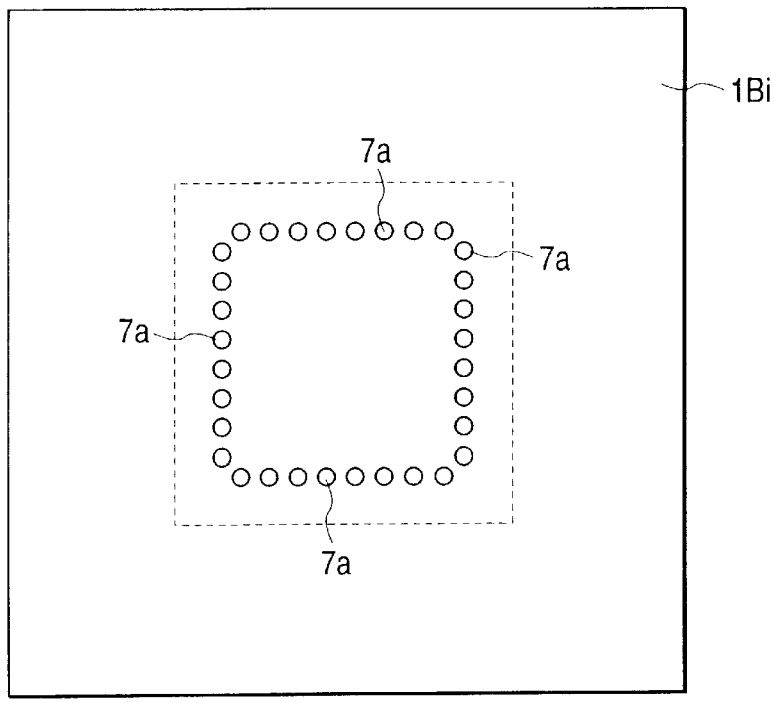
FIG. 12(A) is a top plan view of a chip mounting face of a wiring substrate constituting a semiconductor device according to the embodiment or another of the invention.
Figure 12B:
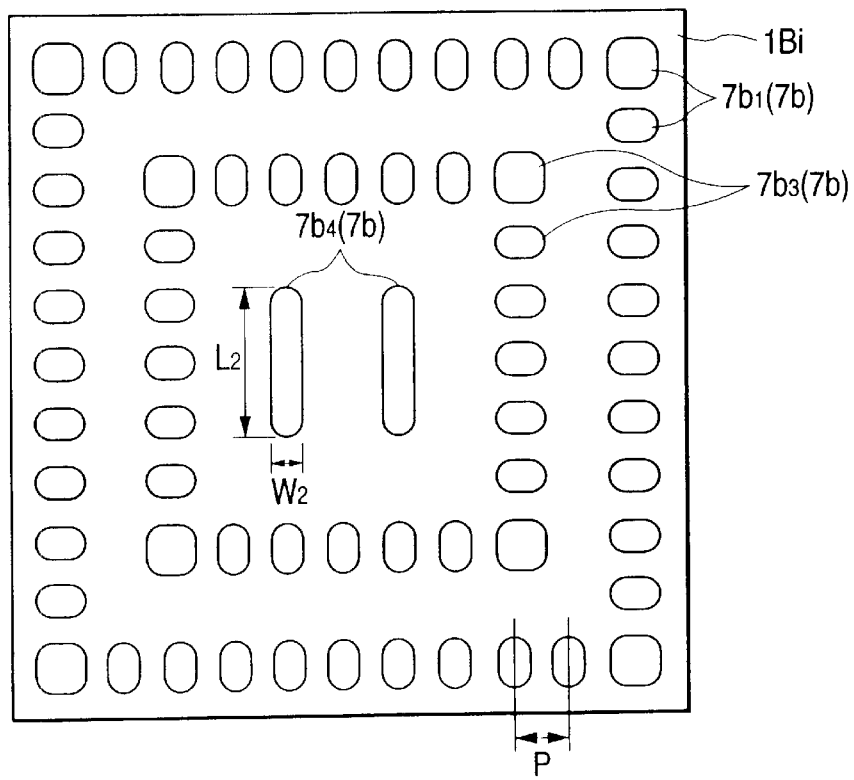
FIG. 12(B) is a top plan view of the back surface of the wiring substrate of the same.

FIG. 12(A) shows the arrangement of the lands 7a on the main surface (i.e., the chip mounting face for mounting the semiconductor chip 1C) of the interposer substrate 1Bi, and FIG. 12(B) shows the arrangement of the lands 7b of the back surface (i.e., the face confronting the wiring substrate 2 for mounting the semiconductor device 1) of the interposer substrate 1Bi.

On the main surface of the interposer substrate 1Bi, as shown in FIG. 12(A), the lands 7a are so regularly arranged in plurality as to correspond to the bump electrodes 1BA of the semiconductor chip 1C. The individual lands 7a are formed into a circle having a diameter of about 50 microns in a top plan view, for example. Here, the broken lines of FIG. 12(A) shows the contour of the semiconductor chip 1C which is mounted on the interposer substrate 1Bi.

As shown in FIG. 12(B), on the other hand, the lands (or the plurality of external terminals) 7b (7b1, 7b3, 7b4) are arranged on the back surface of the interposer substrate 1Bi like the aforementioned bump electrodes (or the plurality of external terminals) 1BB1, 1BB3 and 1BB4. The individual lands 7b (7b1, 7b3, 7b4) form a part of the wiring lines of the interposer substrate 1Bi and form the external terminals. To these lands 7b (7b1, 7b3, 7b4), respectively, there are jointed the soldered portions of the bump electrodes 1BB1, 1BB3 and 1BB4 in the direct contact state. Generally, the top plan shape of the bump electrodes 1BB1, 1BB3 and 1BB4 is defined by that of the lands 7b (7b1, 7b3, 7b4).

Of the plurality of lands 7b1 and 7b3, the lands at the corners are formed to have such a generally square shape (or the second external terminals) as is rounded at the corners. Each of the lands 7b1 and 7b3 has a top plan size basically equal to that of the bump electrodes 1BB1 and 1BB3 at the corners, as exemplified by about 0.45 to 0.6×0.45 to 0.6 mm.

Of the plurality of the lands 7b1 and 7b3, on the other hand, the top plan shape of the lands arranged along the sides of the interposer substrate 1Bi is formed into such a generally rectangular shape (or the first external terminals) as is longer in the direction to intersect the sides of the interposer substrate 1Bi than that in the direction along the sides and as is rounded at the corners. The top plan size of the lands 7b1 and 7b3 is basically equal, as exemplified by about 0.45 to 0.6×0.3 mm, to that of the bump electrodes 1BB1 and 1BB3 arranged along the sides of the interposer substrate 1Bi.

On the other hand, the top plan shape of the central lands 7b4 of the interposer substrate 1Bi is formed into a generally rectangular shape (or the third external terminals) as is rounded at the corners. The length of the lands 7b4 is longer than that of the generally rectangular lands 7b1 and 7b3 and basically equal, as exemplified by about 1.3×0.3 mm, to that of the bump electrodes 1BB4 arranged at the center of the interposer substrate 1Bi.

In Embodiment 4, the top plan shape of the individual lands 7b4 at the center, i.e., the top plan shape of the bump electrodes 1BB4 can be defined in the following manners. Specifically, the absolute value of the difference between the longitudinal size L2 and the transverse size W2 of the lands 7b4 is larger than the adjoining spacing (i.e., the distance or pitch from the center to the center of the adjoining lands 7b1) P (|L2−W2|>P). The top plan size (i.e., L2×W2) of the lands 7b4 is exemplified by about 1.3 microns×0.3 microns.

Figure 13:
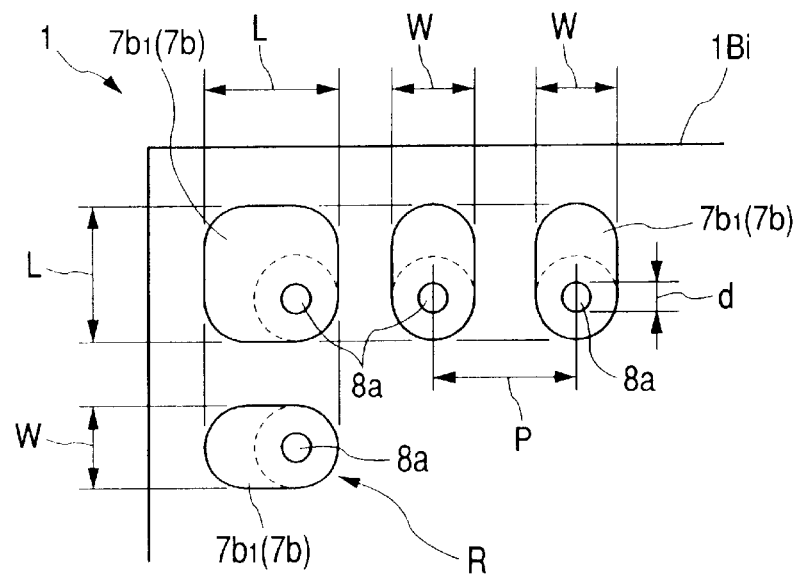
FIG. 13 is an enlarged top plan view of the back surface of the wiring substrate of FIG. 12.

FIG. 13 shows an enlarged top plan view of an essential portion of the back surface of the interposer substrate 1Bi. The broken lines of FIG. 13 have the same indication as that which has been described with reference to FIG. 9. On the other hand, veers (or junctions) 8a are provided for connecting the lands 7b and the internal wiring lines in the interposer substrate 1Bi electrically, as will be described. The veers 8a are formed into such a top plan circular shape as has a diameter d to be fitted in the lands 7b. Here, these veers 8a are not formed to extend through the lands 7b so that they are not exposed to the surfaces of the land 7b, but are shown by solid lines for conveniences of the description in FIG. 13.

In Embodiment 4, the top plan shape of the lands 7b1 and 7b3, i.e.; the top plan shape of the bump electrodes 1BB1 and 1BB3 can be defined in the following manner. Specifically, the absolute value of the difference between the longitudinal size L and the transverse size W of the lands 7b1 and 7b3 is larger than the diameter d of the veers 8a (i.e., |L−W|>d). Here, the corners of the lands 7b (7b1, 7b3, 7b4) have a radius of curvature R of about 0.15 microns, for example.

Figure 14:
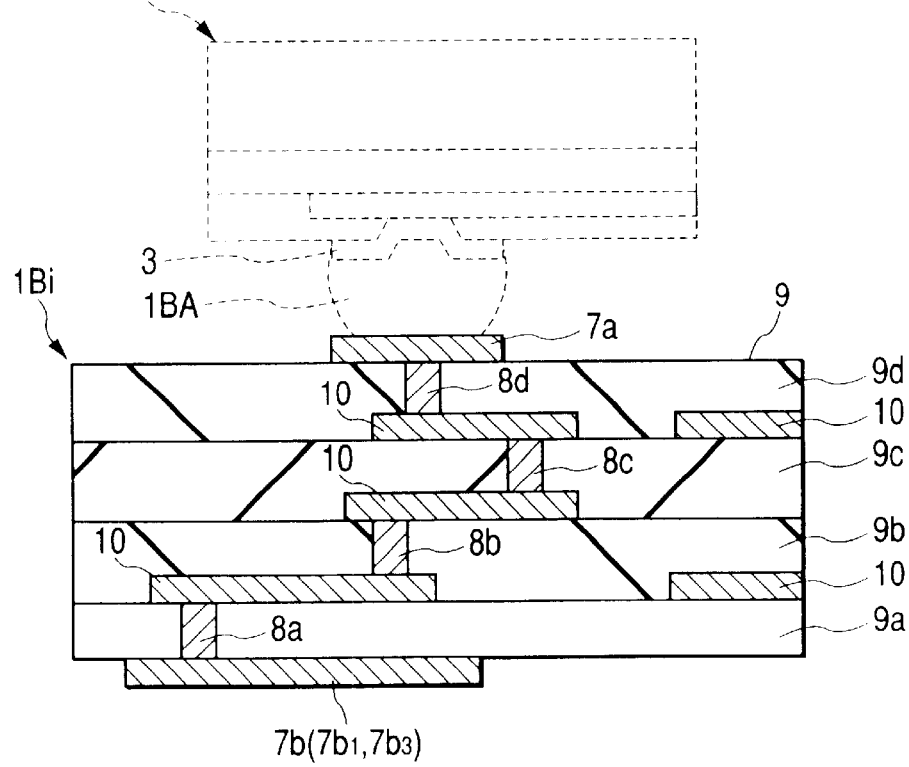
FIG. 14 is a sectional view of an essential portion of the wiring substrate of FIG. 12.

FIG. 14 presents a sectional view of an essential portion of the interposer substrate 1Bi. This interposer substrate 1Bi has a five-layered wiring structure, for example. However, the interposer substrate 1Bi should not be limited to the five wiring layers but could be modified in various manners. A base 9 of the interposer substrate 1Bi is formed by laminating insulating layers 9a to 9d exemplified by ceramics, a glass epoxy resin or a polyimide resin. When the base 9 of the interposer substrate 1Bi is made of ceramics, it can improve the heat radiation because of its high heat conductivity. Since the difference in the coefficient of thermal expansion from that of the semiconductor chip 1C can be reduced, moreover, it is possible to suppress or prevent the deformation or breakage of the bump electrodes 1BA, as might otherwise be caused by the thermal stress.

On the main surface and back surface of the interposer substrate 1Bi, i.e., on the main surface and back surface of the base 9, there are formed the plurality of lands 7a and 7b, as has been described hereinbefore. In the interposer substrate 1Bi, i.e., between the insulating layers 9a to 9d of the base 9, on the other hand, there are formed internal wiring lines 10. In the insulating layers 9a to 9d of the base 9, moreover, there are formed the veers 8a to 8d. These veers 8a to 8d are wiring members for connecting the different layer wiring lines electrically and are formed by burying a conductive film in the holes formed in the insulating layers 9a to 9d. In other words, the lands 7a and 7b are electrically connected with the internal wiring lines 10 through the veers 8d and 8a, respectively. On the other hand, the internal wiring lines 10 in the different wiring lines are electrically connected with each other through the veers 8b and 8c.

When the base is made of ceramics, a refractory metal such as tungsten can be employed as the major material for the wiring lines (i.e., the lands 7a and 7b, the veers 8a to 8d and the internal wiring lines 10) of the interposer substrate 1Bi. In the lands 7a and 7b, the major material or tungsten is plated on its surface with nickel or gold. When the base 9 is made of a resin material such as a glass epoxy resin or a polyimide resin, on the other hand, a low-resistance material such as copper (Cu) can be employed as the major material of the wiring lines (i.e., the lands 7a and 7b, the veers 8a to 8d and the internal wiring lines 10).

Here will be described the wiring substrate 2. As shown in FIG. 10, the semiconductor device 1 is mounted as in Embodiments 1 to 3 on the main surface of the wiring substrate 2 through the bump electrodes 1BB (1BB1, 1BB3, 1BB4). The soldered portions of these bump electrodes 1BB are jointed in the direct contact state to the lands 11a of the main surface of the wiring substrate 2. The bump electrodes 1BB1, 1BB3 and 1BB4 are jointed to lands 11a1, 11a3 and 11a4, respectively.

Figure 15:
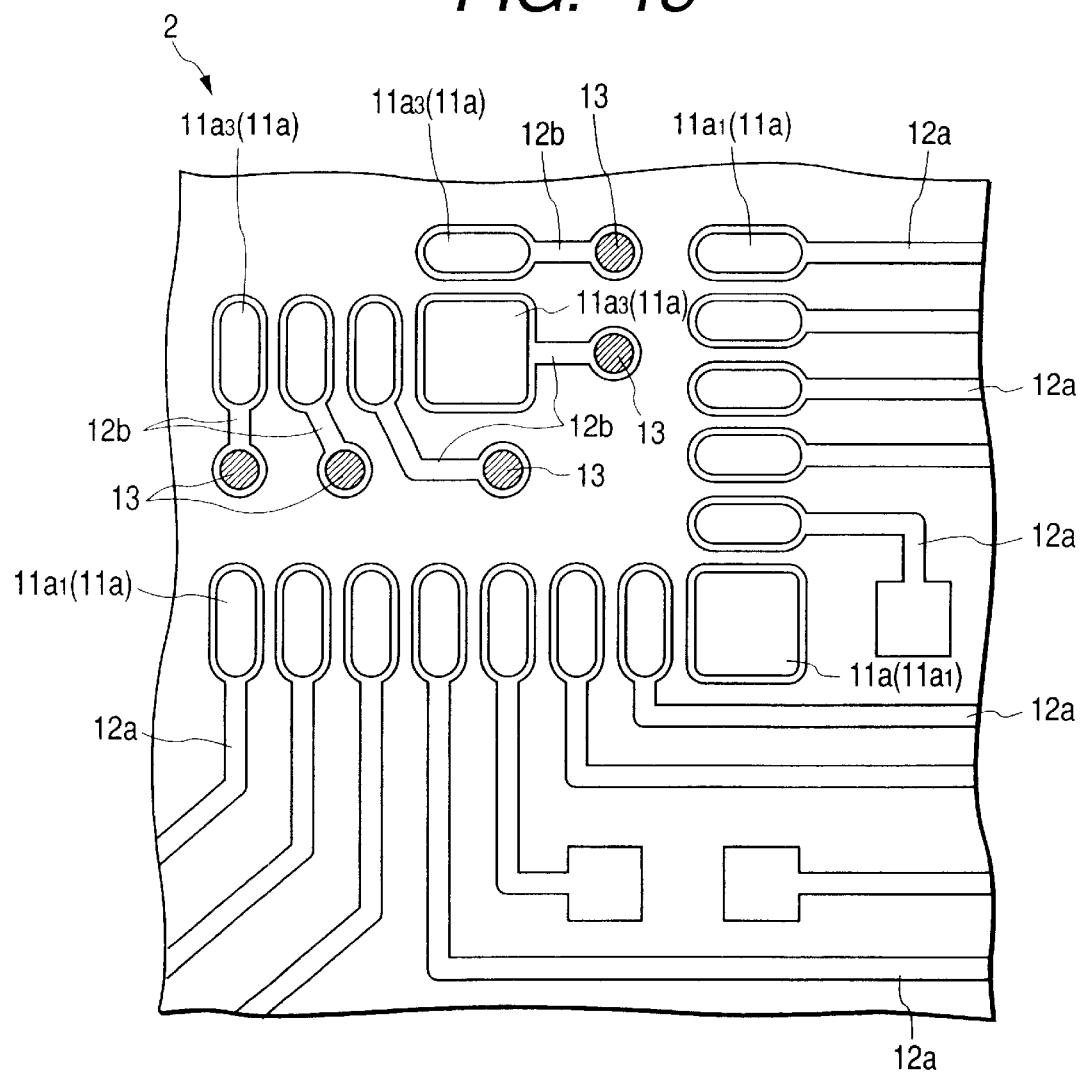
FIG. 15 is a top plan view of an essential portion of the surface of a substrate for mounting a semiconductor device according to the embodiment of the invention.

FIG. 15 is a top plan view of an essential portion of the main surface of the wiring substrate 2. The lands 11a (11a1, 11a3, 11a4) of the wiring substrate 2 are arranged to correspond to the bump electrodes 1BB (1BB1, 1BB3, 1BB4) of the interposer substrate 1Bi, i.e., the lands 7b (7b1, 7b3, 7b4). The top plan shape, top plan size and adjoining spacing (or pitch) of the lands 11a (11a1, 11a3, 11a4) are basically identical to those of the corresponding bump electrodes 1BB (1BB1, 1BB3, 1BB4) of the interposer substrate 1Bi, i.e., the lands 7b (7b1, 7b3, 7b4), respectively. In short, the lands 11a of the wiring substrate 2 are also formed to have different longitudinal and transverse top plan sizes. As a result, the junction areas between the bump electrodes 1BB and the lands 11a can be increased to improve the junction strength of the semiconductor device 1 mounted on the wiring substrate 2. Here, the individual lands 11a (11a1, 11a3, 11a4) are rounded (or rounded/tapered) at their corners.

The lands 11a1 are arranged in plurality near and along the outer periphery of the mounted region of the semiconductor device 1. The lands 11a1 are formed integrally with wiring lines 12a and are led to the outside of the mounting region of the semiconductor device 1. Of the lands 11a1, however, the lands 11a1 arranged at the corners (i.e., the lands to which the bump electrodes 1BB1 at the corners of the interposer substrate 1Bi are to be jointed) are not connected with the wiring lines 12a but have an isolated pattern formed in a generally square top plan shape, for example.

On the other hand, the lands 11a3 are arranged in plurality along the adjoining direction of the lands 11a1 in such regions of the mounting region of the semiconductor device 1 as are enclosed by one group of the lands 11a1. The lands 11a3 are formed integrally with wiring lines 12b, through which they are electrically connected with through holes 13. Here, the lands 11a1 and 11a3 are formed at the end portions of the wiring lines 12a and 12b, for example, although not especially limitative thereto. For example, the lands 11a1 and 11a3 may be formed at positions midway of the wiring lines 12a and 12b.

Figure 16:
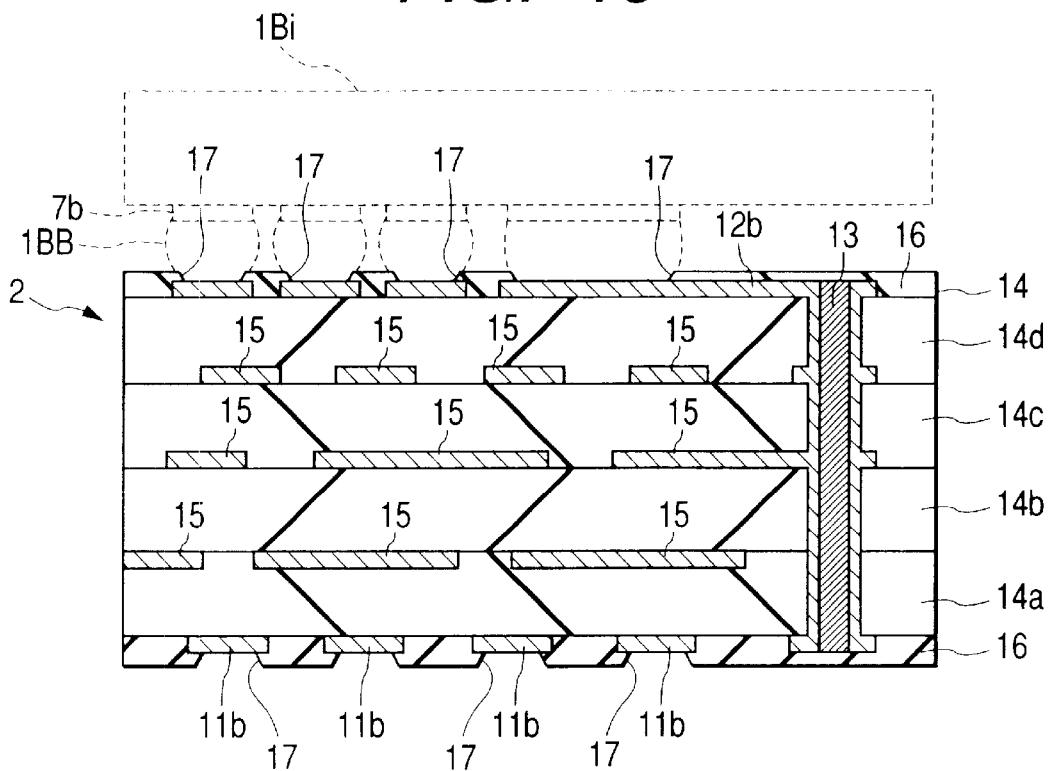
FIG. 16 is a sectional view of an essential portion of the substrate of FIG. 15.

FIG. 16 presents a sectional view of an essential portion of the wiring substrate 2. Here, the broken lines in FIG. 16 show the mounted state of the interposer substrate 1Bi. Here is exemplified the wiring substrate 2 of the two-side mounting type, which could be replaced by the wiring substrate 2 of the one-side mounting type.

The wiring substrate 2 has the five-layered wiring structure, for example. However, the wiring substrate 2 should not be limited to the five-layered wiring structure but could be modified in various manners. The wiring substrate 2 has a base 14 formed by laminating insulating layers 14a to 14d of a glass epoxy resin, for example. On the main surface and back surface of the wiring substrate 2, i.e., on the main surface and back surface of the base 14, there are formed lands 11a and 11b. Inside of the wiring substrate 2, i.e., between the insulating layers 14a to 14d of the base 14, on the other hand, there are formed internal wiring lines 15. In the insulating layers 14a to 14d of the base 14, moreover, there are formed the through holes 13. These through holes 13 are the wiring members for connecting the different layer wiring lines electrically, and a conductive film is formed in the holes which are bored in the insulating layers 14a to 14d. Here are exemplified by the through holes 13 which extend from the main surface to the back surface of the wiring substrate 2. In the remaining portions, however, there are also formed the through holes for connecting the internal wiring lines 15 with each other and the lands 11a and 11b and the internal wiring lines 15. The wiring lines (e.g., the lands 11a and 11b, the through holes 13 or the wiring lines 12a and 12b) of such wiring substrate 2 are made of copper, for example. Here, a solder resist film 16 is formed on the main surface and back surface of the wiring substrate 2. In a portion of the solder resist film 16, there are formed openings 17, from which the lands 11a and 11b are partially exposed to the outside. The bump electrodes 1BB are jointed to the portions of the lands 11a, as exposed from the openings 17.

According to Embodiment 4, there can be achieved the following effects in addition to those obtained by Embodiments 1 to 3. Specifically, the top plan shape of the bump electrodes 1BB4 for the power source are formed into the rectangular shape having the rounded corners so that the power source of the semiconductor device 1 can be strengthened. On the other hand, the transverse size of the bump electrodes 1BB4 is equalized to that of the other bump electrodes 1BB1 and 1BB3 so that the power source of the semiconductor device 1 can be strengthened without inviting a large size of the semiconductor device 1.

(Embodiment 5)

Embodiment 5 is different from Embodiments 1 to 4 in the top plan shape of the bump electrodes of the semiconductor chip. The residuals are identical to those of Embodiments 1 to 4.

Figure 17:
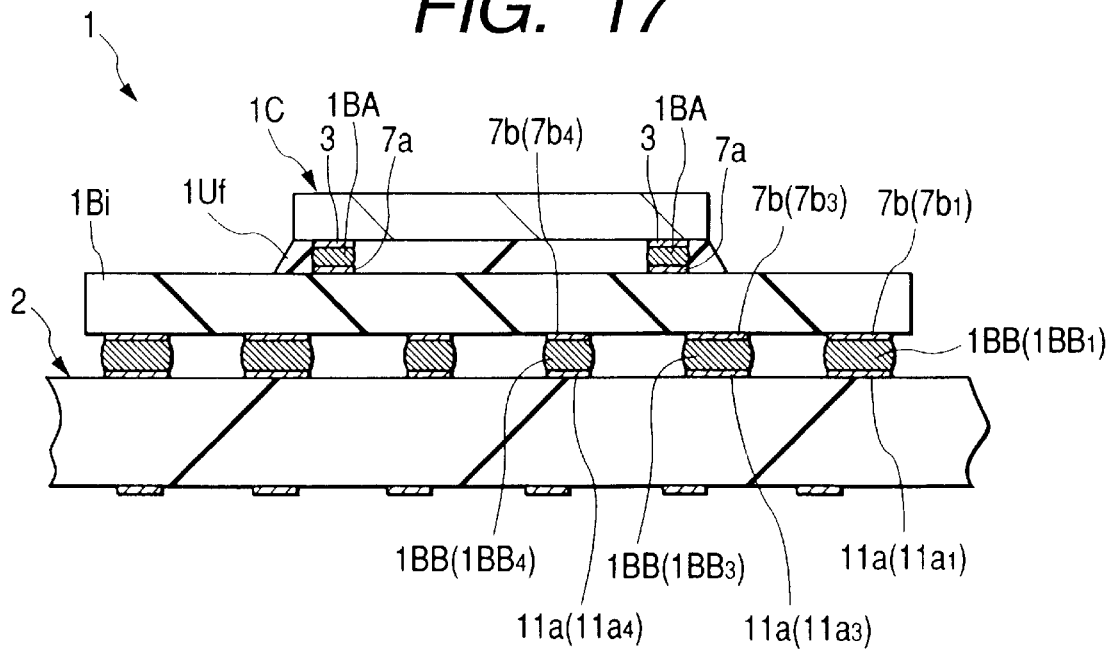
FIG. 17 is a sectional view showing the state in which a semiconductor device according to a further embodiment of the invention is mounted.
Figure 18A:
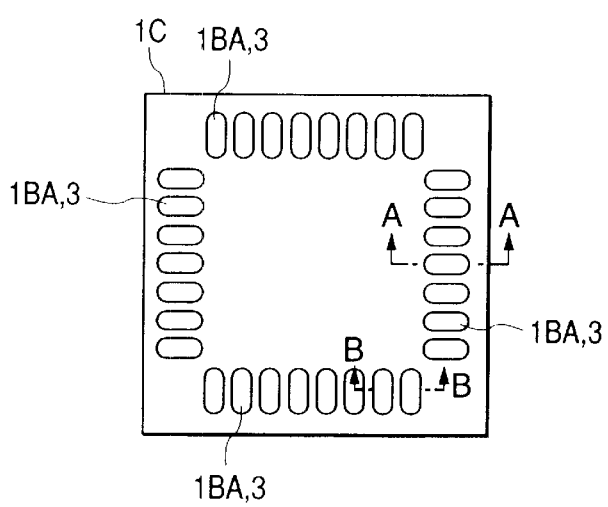
FIG. 18(A) is a top plan view of the main surface of a semiconductor chip constituting the semiconductor device of FIG. 17.
Figure 18B:
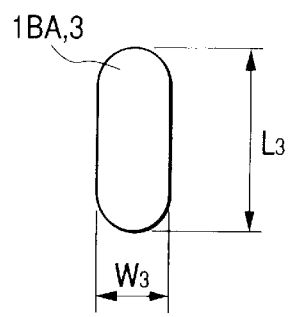
FIG. 18(B) is an enlarged top plan view of an electrode of FIG. 18(A)
Figure 18C:
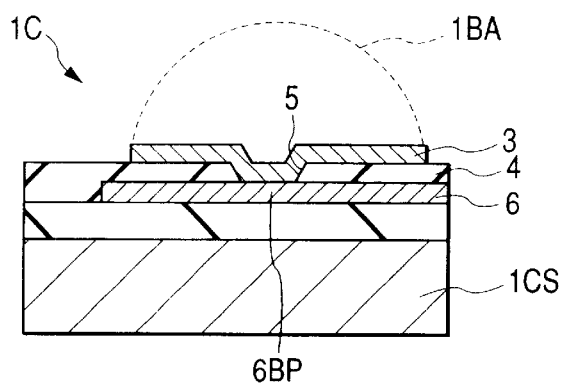
FIG. 18(C) is a sectional view along line A—A of FIG. 18(A)
Figure 18D:
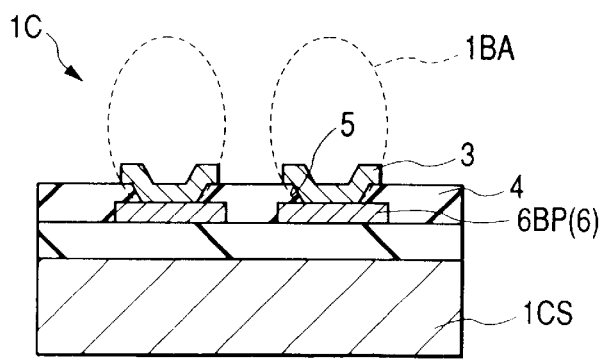
FIG. 18(D) is a sectional view along line B—B of FIG. 18(A)

FIG. 17 is a sectional view of a portion along line A—A of FIGS. 8 and 9 when the semiconductor device 1 of Embodiment 5 is mounted on the wiring substrate 2. On the other hand: FIG. 18(A) is a top plan view of the main surface (or the mounting face) of the semiconductor chip 1C of FIG. 17; FIG. 18(B) is a top plan view of the bump electrode 1BA (or the primary metal films 3) extracted from the semiconductor chip 1C; and FIGS. 18(C) and 18(D) are sectional views along line A—A and line B—B of FIG. 18(A), respectively.

In Embodiment 5, the bump electrodes 1BA (or the primary metal films 3) of the semiconductor chip 1C are patterned such that their size in the direction to intersect the sides of the semiconductor chip 1C is longer than that in the direction along the sides of the semiconductor chip 1C.

Here, the top plan shape of the bump electrodes 1BA can be defined in the following manner, for example. Specifically, the absolute value of the difference between the longitudinal size L3 and the transverse size W3 of the bump electrodes IBA (or the primary metal films 3) is smaller than the absolute value of the difference between the longitudinal size L and the transverse size W of the bump electrodes 1BB1 and 1BB3 (or the lands 7b1 and 7b3) of the interposer substrate 1Bi (|L3−W3|<|L−W|). Here, the bump electrodes 1BA (or the primary metal films 3) has the longitudinal size L3 of about 50 microns and the transverse size W3 of about 100 microns, for example. On the other hand, the distance from the center to the center of the bump electrodes 1BA (or the primary metal films 3) adjoining each other is for example about 150 microns.

Figure 19:
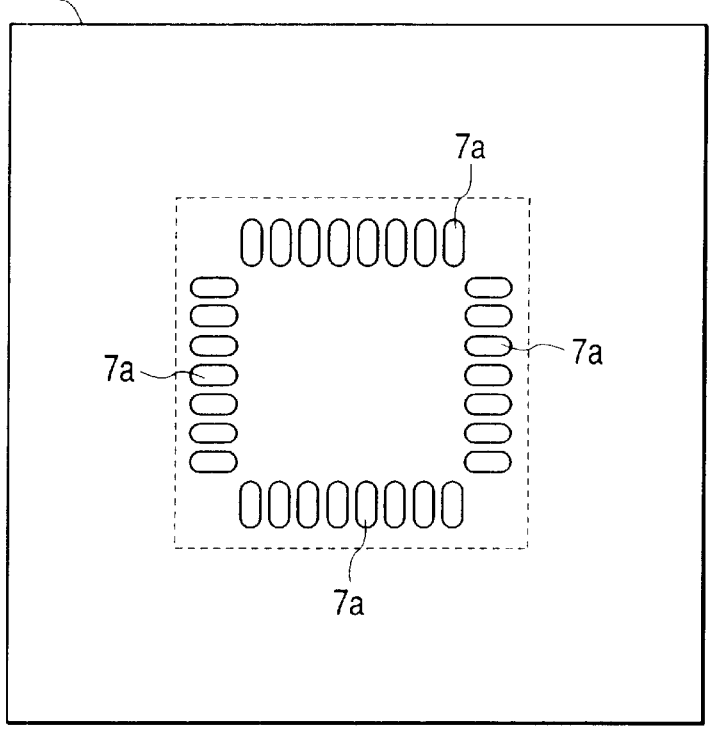
FIG. 19 is a top plan view of the surface of the wiring substrate for mounting the semiconductor chip of FIG. 17.

On the other hand, FIG. 19 presents a top plan view of the main surface of the interposer substrate 1Bi (or the mounting face of the semiconductor chip 1C) in the case of Embodiment 5. Here, the broken lines of FIG. 19 show the contour of the semiconductor chip 1C.

In Embodiment 5, the top plan shape of the bump electrodes 1BA (or the primary metal films 3) of the semiconductor chip 1C is changed, as described above, and the top plan shape of the lands 7a of the main surface of the interposer substrate 1Bi is accordingly changed. Specifically, the top plan shape of the lands 7a of the interposer substrate 1Bi is pattered such that their size in the direction to intersect the sizes of the semiconductor chip 1C is longer than the size in the direction along the sides of the semiconductor chip 1C. Here, the top plan shape, the top plan size and the adjoining spacing (or pitching) of the lands 7a are substantially identical to those of the bump electrodes 1BA.

In Embodiment 5, too, it is possible to achieve effects similar to those of Embodiments 1 to 4.

(Embodiment 6)

An semiconductor device 1 of Embodiment 6 is constituted to have predetermined circuit functions as a whole by mounting the semiconductor chip and other elements on the common interposer substrate. Here, the sizes of the same construction portions as those of Embodiments 1 to 5 are identical to those of Embodiments 1 to 5, unless otherwise specified.

Figure 20:
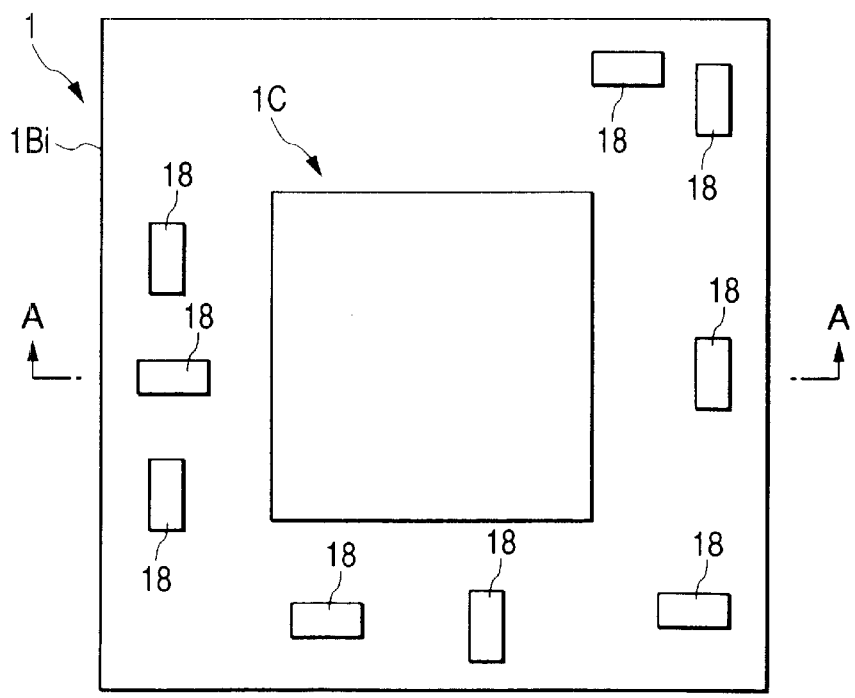
FIG. 20 is a top plan view showing the main surface of a semiconductor device according to a further embodiment of the invention.
Figure 21:
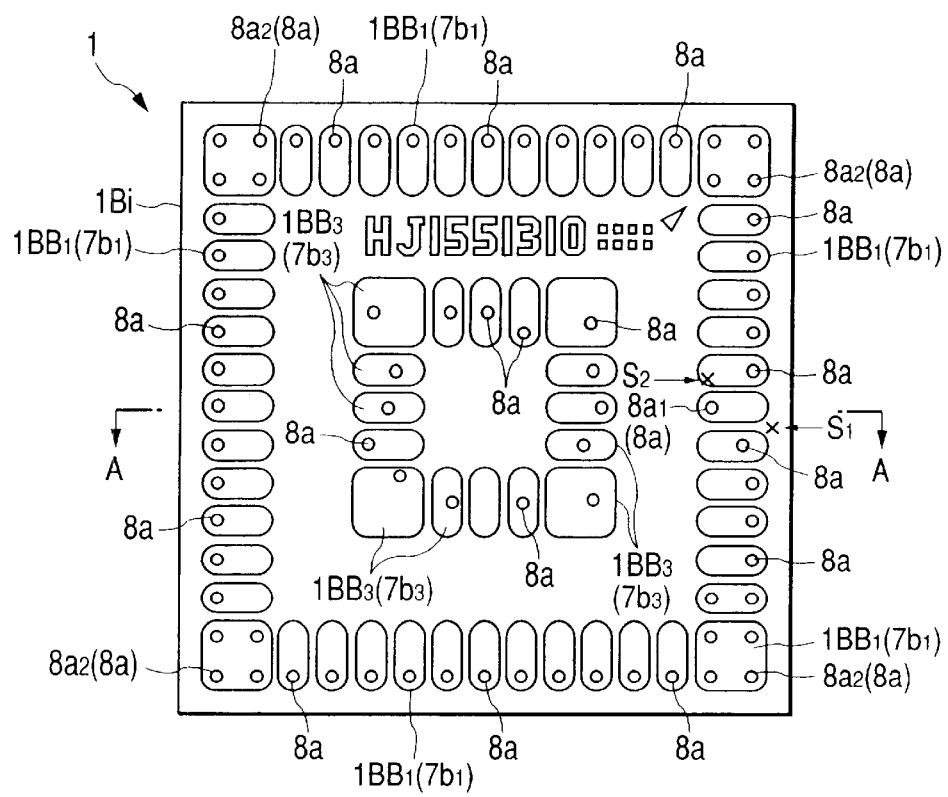
FIG. 21 is a top plan view of the back surface of a wiring substrate in the semiconductor device of FIG. 20.
Figure 22:
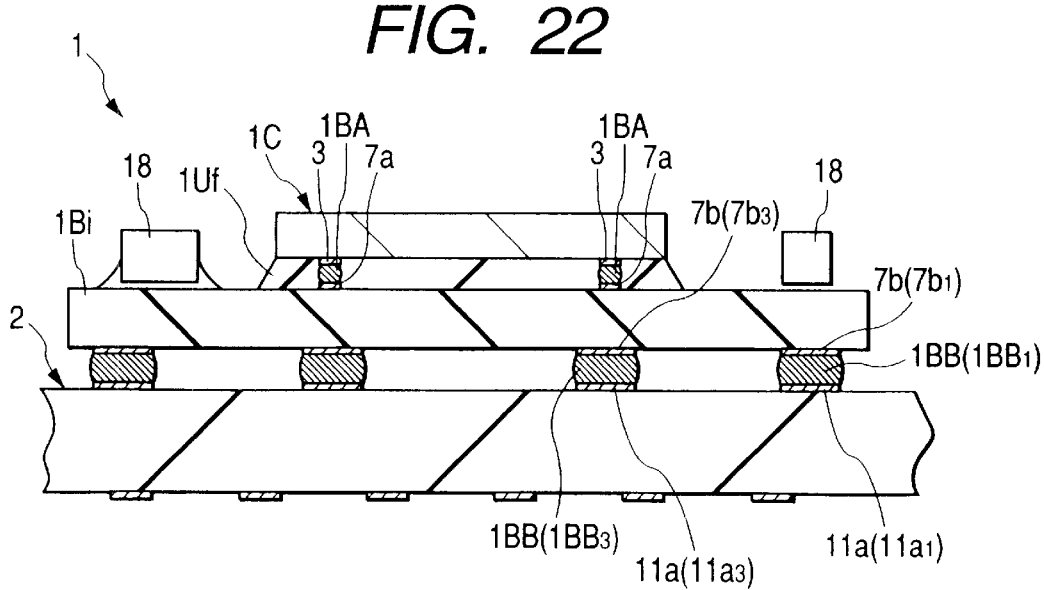
FIG. 22 is a sectional view showing the state in which the semiconductor device of FIGS. 20 and 21 is mounted.

FIGS. 20 and 21 present the main surface and the back surface of the semiconductor device 1 of Embodiment 6, respectively. On the other hand, FIG. 22 presents a sectional view of a portion corresponding to line A—A of FIGS. 20 and 21 when the semiconductor device 1 is mounted on the wiring substrate 2. In FIG. 21, too, the veers 8a do not extend through the lands 7b so that they are not exposed to the surfaces of the land 7b, but are shown by solid lines for conveniences of the description.

In Embodiment 6, passive elements 18 such as resistors, capacitors or coils are planarly mounted on the main surface of the interposer substrate 1Bi. The top plan size of the interposer substrate 1Bi is slightly larger than those of Embodiments 1 to 5, as exemplified by about 8×8 mm. On the other hand, the longitudinal size of the bump electrodes 1BB (1BB1, 1BB3) of the back surface of the interposer substrate 1Bi, i.e., the lands 7b (7b1, 7b3) is also larger than those of Embodiments 1 to 5, as exemplified by about 0.45 to 0.8 microns. This longitudinal size has the maximum at which two bump electrodes 1BB2 of the ordinary circular shape can be just arranged while retaining their adjoining spacing (i.e., the pitch at about 0.5 mm). Specifically, the bump electrodes 1BB (1BB1, 1BB3) and the lands 7b (7b1, 7b3) are so arranged to match the ordinary circular bump electrodes (or lands). As a result, the lands 7b (7b1, 7b3) can be easily arranged to improve the designing feasibility of the interposer substrate 1Bi. Of the bump electrodes 1BB (1BB1, 1BB3), i.e., the lands 7b (7b1, 7b3), more specifically,. the larger ones at the corners have a top plan size of about 0.8×0.8 microns.

In Embodiment 6, on the other hand, the bump electrodes 1BB (1BB1, 1BB3), i.e., the lands 7b (7b1, 7b3) are formed into the rectangular shape having the rounded corners so that the degree of freedom for arranging the veers 8a can be improved. In FIG. 21, for example, the top plan position of a predetermined veer 8a can be arranged with a shift from other veers 8a. This arrangement makes it possible to improve the degree of freedom for leading around the signal wiring lines of the interposer substrate 1Bi.

The reasons for this structure will be described by way of a veer 8a1 in FIG. 21. If the veer 8a1 is arranged without any shift from other veers 8a but on a straight line where a group of other veers 8a are arranged, the veer 8a1 is arranged between a point S1 and a point S2, as tentatively shown in FIG. 21. For connecting the point S1 and the point S2 through a wiring line, therefore, the wiring line has to be bent while avoiding the veer 8a1. This makes it difficult to arrange the wiring lines of the interposer substrate 1Bi. On the other hand, the wiring length is enlarged by the bend of the wiring line, and the number of positions of field concentrations increases with the increase in the bent portions of the wiring line, so that the electric characteristics of the wiring line is lowered. Moreover, the bend of the wiring line increases the quantity of data for designing the wiring lines. Therefore, it becomes difficult to design the wiring lines of the interposer substrate 1Bi.

Figure 23:
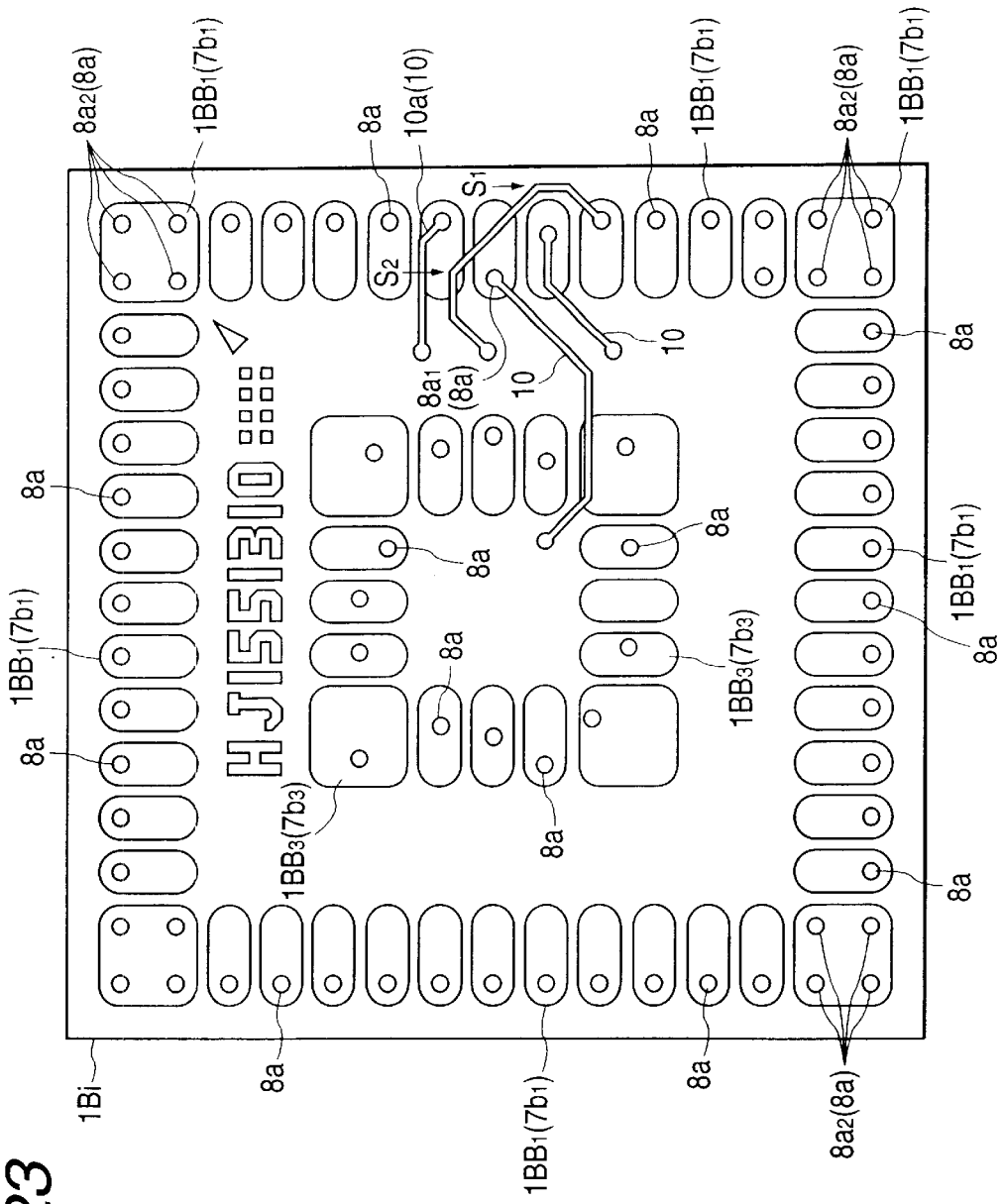
FIG. 23 is a top plan view of the back surface of the wiring substrate in the semiconductor device of FIG. 20.

In Embodiment 6, on the other hand, the veer 8a1 can be arranged with a shift from the other veers 8a, as shown on FIG. 23, so that the point S1 and the point S2 can be substantially linearly joined by an oblique wiring line (or an internal wiring line 10a). This makes it easy to arrange the internal wiring line 10. On the other hand, the bent portions of the internal wiring line 10 can be reduced to shorten the wiring length, and the portions of field concentrations can be reduced to improve the electric characteristics of the internal wiring line 10. Moreover, the bent portions of the internal wiring line 10 can be reduced to reduce the quantity of data for designing the wiring lines. As a result, it is possible to improve the feasibility of the wiring design of the interposer substrate 1Bi. In FIG. 23, too, the veers 8a do not extend through the lands 7b so that they are not exposed to the surfaces of the land 7b, but are shown by solid lines for conveniences of the description. On the other hand, this structure can also be applied to Embodiments 1 to 5.

In Embodiment 6, as shown in FIGS. 21 and 23, a plurality of veers 8a2 are arranged at such large-sized bump electrodes 1BB1 (or the lands 7b1) of the outermost periphery bump electrodes 1BB1 (or the lands 7b1) on the back surface of the interposer substrate 1Bi as are arranged at the corners. Here is exemplified the case in which totally four veers 8a2 are individually arranged near the four corners of one large-sized bump electrode 1BB1 (or the land 7b1), for example. The large-sized bump electrodes 1BB1 (or the lands 7b1) are not electrically connected with the circuit of the semiconductor device 1. Therefore, it is intrinsically unnecessary to arrange the veers 8a2. The reason why the veers 8a2 are arranged in Embodiment 6 will be described in the following. Specifically, the highest stress is applied to the portions of the bump electrodes 1BB1 (or the lands 7b1) at the outermost peripheral corners of the back surface of the interposer substrate 1Bi and may separate the lands 7b1 at the corners from the interposer substrate 1Bi. In Embodiment 6, therefore, the veers 8a2 are arranged in the lands 7b1 at the corners to suppress or prevent the lands 7b1 from being separated from the interposer substrate 1Bi.

Figure 24:
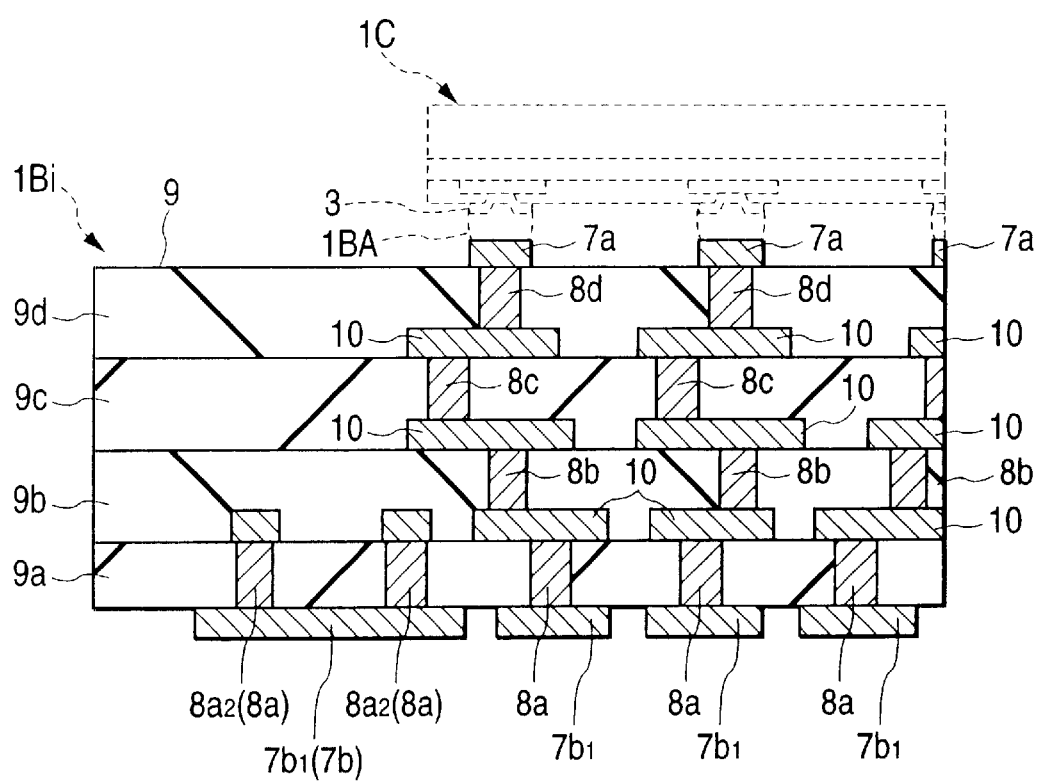
FIG. 24 is a sectional view of an essential portion of the wiring substrate in the semiconductor device of FIG. 20.

A sectional view of the portions of the bump electrodes 1BB1 (or the lands 7b1) at the corners and the veers 8a2 is shown in FIG. 24. The veers 8a2 are constituted as in the ordinary veers 8a (i.e., the veers functioning as the wiring lines) by burying a conductive film of tungsten or the like. The conductive film in the veers 8a2 is jointed to the lands 7b1. Here, the veers 8a2 and the lands 7b can be firmly jointed by making the conductive film in the veers 8a2 and the conductive film of the lands 7b1 of the common material (e.g., tungsten). As a result, it is possible to improve the junction strength of the lands 7b1 at the corners with respect to the interposer substrate 1Bi. Here, the number of veers 8a2 should not be limited to four but could be changed into various values. This structure can also be applied to Embodiments 1 to 5.

(Embodiment 7)

In Embodiment 7, of the bump electrodes (or lands) on the back surface of the interposer substrate, a predetermined bump electrode (or land) is made far longer in its longitudinal size than that of the remaining bump electrodes (or lands). In Embodiment 7, on the other hand, a plurality of veers are arranged in such a predetermined bump electrode (or land) of the bump electrodes (or lands) on the back surface of the interposer substrate as is electrically connected with the circuit of the semiconductor device. The remaining portions are identical to those of Embodiment 6.

Figure 25:
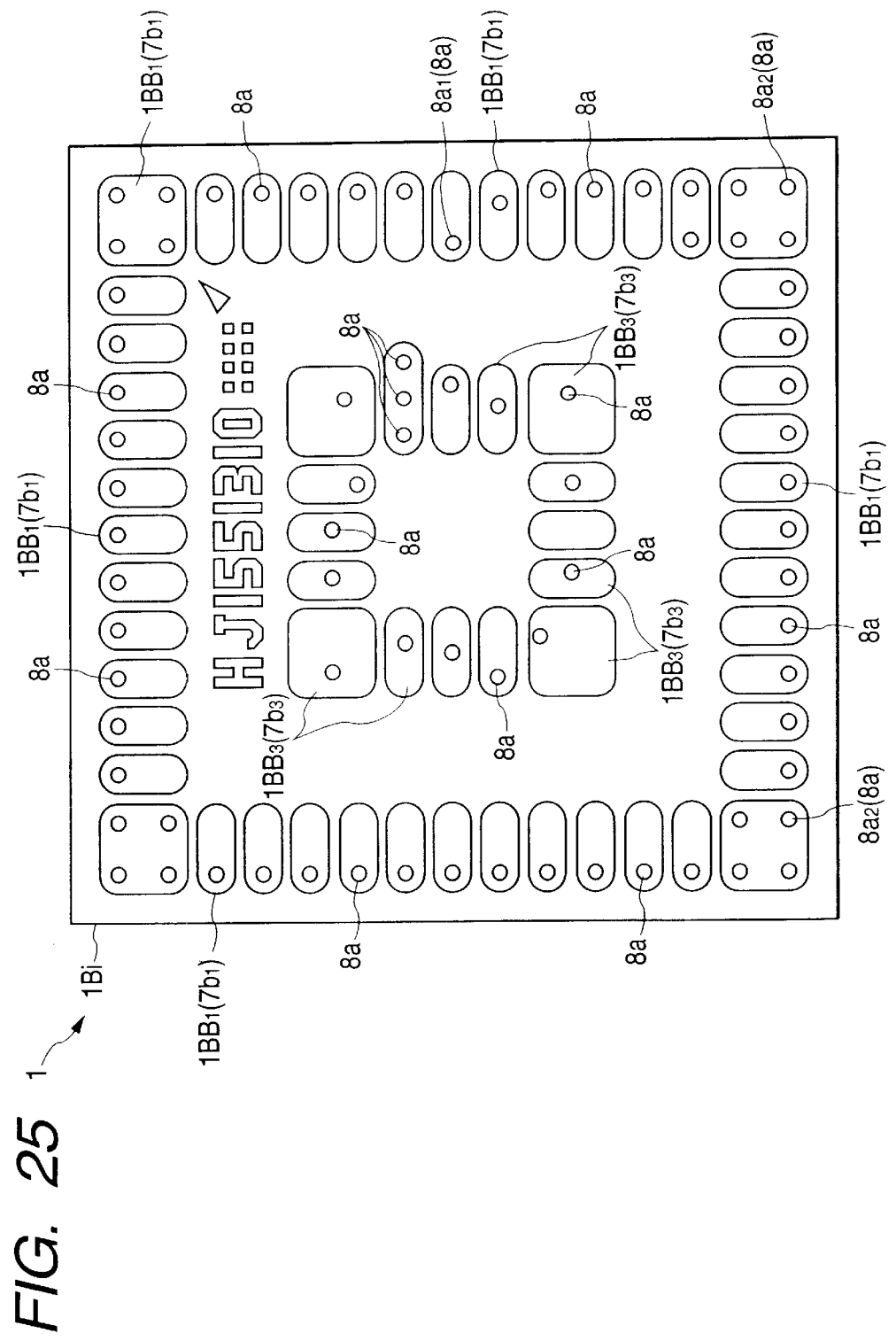
FIG. 25 is a top plan view of a wiring substrate in a semiconductor device according to a further embodiment of the invention.

FIG. 25 shows one example of the back surface of the interposer substrate 1Bi of the semiconductor device 1 of Embodiment 7. In FIG. 25, too, the veers 8a do not extend through the lands 7b so that they are not exposed to the surfaces of the land 7b, but are shown by solid lines for conveniences of the description.

For example, one of the bump electrodes 1BB3 (or the lands 7b3) arranged inside is made longer than the remaining bump electrodes 1BB3 (or the lands 7b3). Here is exemplified the case in which a plurality of (e.g., three) veers 8a are arranged for the longer bump electrode 1BB3 (or the land 7b3).

Here is also exemplified the case in which a plurality of (e.g., two) veers 8a are arranged in a predetermined bump electrode 1BB1 (or the land 7b1) of the outermost periphery bump electrodes 1BB1 (or the lands 7b1) That bump electrode 1BB1 (or the land 7b1) is not different in its top plan size from the remaining ones.

Thus, the bump electrodes 1BB1 and 1BB3 (or the lands 7b1 and 7b3), in which the plurality of veers 8a are arranged, are electrodes for supplying the aforementioned power voltage at the lower or higher potential to the semiconductor device 1. In Embodiment 7, by arranging the plurality of veers 8a for one power source bump electrode 1BB1 or 1BB3 (or the land 7b1 or 7b3), the impedance of the power lines can be lowered to supply a stable potential to the semiconductor device 1. This structure can also be applied to Embodiments 1 to 6. Especially, the structure can be applied to the bump electrodes 1BB4 (or the land 7B4) for the power source of Embodiment 4.

In Embodiment 7, on the other hand, one veer 8a is arranged for the signal bump electrodes 1BB1 and 1BB3 (or the lands 7b1 and 7b3) . As a result, it is possible to facilitate the impedance design of the signal wiring lines.

(Embodiment 8)

Figure 26A:
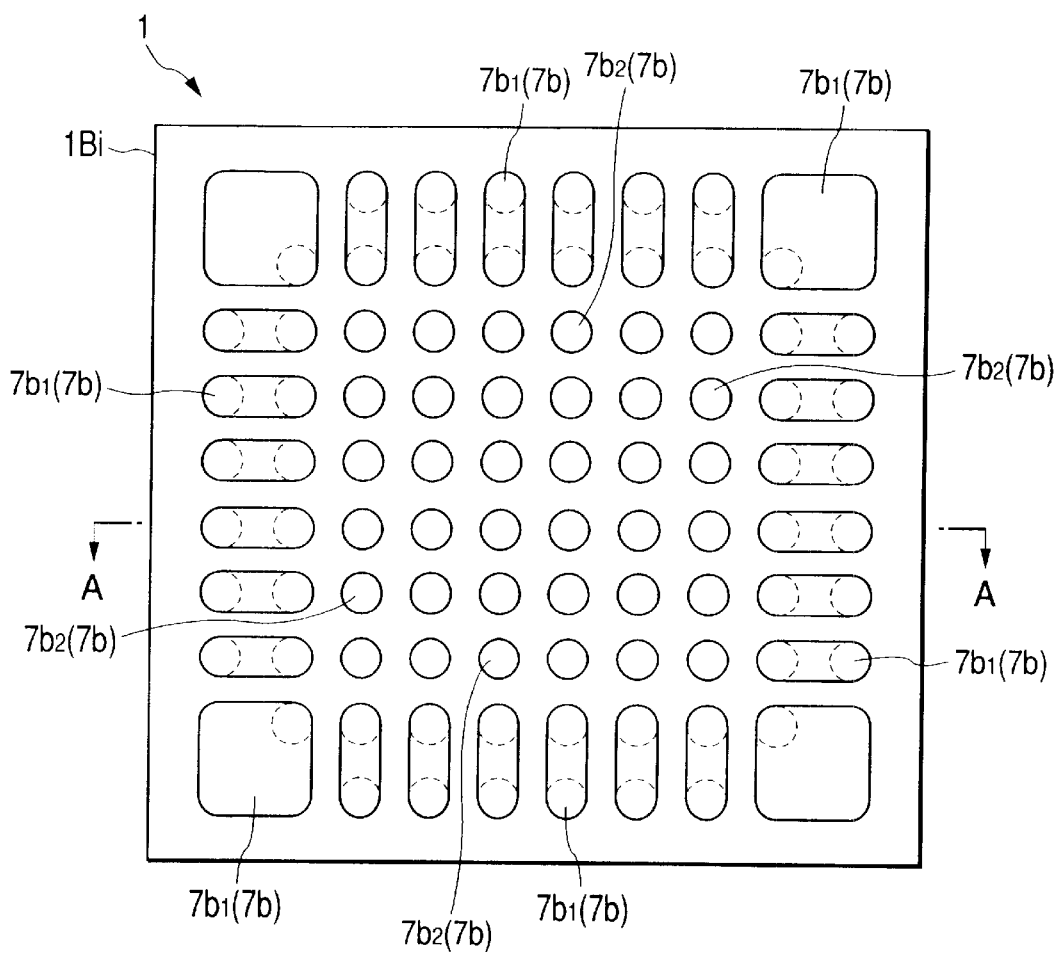
FIG. 26(A) is a top plan view of the back surface of a wiring substrate in a semiconductor device according to a further embodiment of the invention.
Figure 26B:
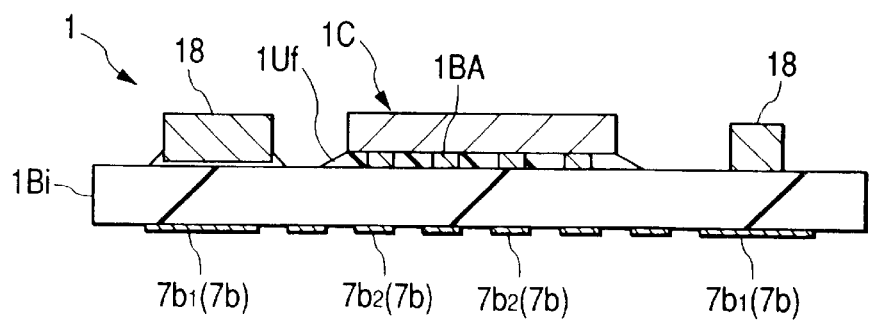
FIG. 26(B) is a sectional view along line A—A of FIG. 26(A).

A semiconductor device of Embodiment 8 is exemplified by a semiconductor device of the LGA (Land Grid Array) type. FIGS. 26(A) and 26(B) present the back surface of the interposer substrate 1Bi of the semiconductor device 1 of Embodiment 8 and a sectional view along line A—A of FIG. 26(A), respectively. Here, the broken lines of FIG. 26(A) have the same indication as that which has been described with reference to FIG. 9.

In Embodiment 8, as in Embodiment 6, the semiconductor chip 1C and the plurality of passive elements 18 are mounted on the main surface of the interposer substrate 1Bi so that they constitute predetermined circuit functions as a whole. Here, the portions of the bump electrodes 1BA and their peripheries have the same structures as those of Embodiments 4 to 7 so that they are omitted from FIG. 26(B).

In the semiconductor device 1 of Embodiment 8, on the other hand, the arrangement and the top plan shape of the lands (or the plurality of external terminals) 7b (7b1, 7b2) of the back surface of the interposer substrate 1Bi are substantially identical to those of Embodiment 1. What is different from Embodiment 1 is that the longitudinal size of the outermost periphery lands (or the first external terminals) 7b1 is set to such a length as can arrange just two ordinary circular lands while including their adjoining spacing (or the aforementioned pitch such as about 0.5 mm), as indicated by broken lines in FIG. 26. In short, the lands 7b1 are arranged to match the arrangement of the ordinary circular bump electrodes (or the lands). As in Embodiment 6, therefore, the lands 7b (7b1, 7b2) can be easily arranged to facilitate the designing of the interposer substrate 1Bi. Here, the structure of Embodiment 8 could be applied to Embodiments 1 to 7.

Although our invention has been specifically described in connection with its embodiments, it should not be limited to Embodiments 1 to 8 but could naturally be modified in various manners without departing from the gist thereof.

For example, Embodiments 1 to 8 have been described on the case in which all the bump electrodes near the outer periphery of the interposer substrate are changed in the longitudinal and transverse sizes. However, the invention should not be limited to that case but may be modified such that a predetermined number of bump electrodes near the outer periphery are the ordinary circular bump electrodes.

On the other hand, Embodiment 4 has been described on the case in which the rectangular bump electrodes (or the lands) having the rounded corners at the center of the back surface of the interposer substrate are the bump electrodes (or the lands) for supplying the power voltage. However, the bump electrodes should not be limited thereto but may be exemplified by dummy external terminals which are not connected with the circuit of the semiconductor device.

In the description thus far made, our invention has been described on the case in which it is applied to a semiconductor device for a mobile telephone or a portable computer of the field of application for its background. However, the invention should not be applied thereto but could be applied to a semiconductor device for a large-sized computer, another electronic device or an information processing device.

The effects obtainable from a representative of the invention disclosed herein will be briefly described in the following.

(1) According to the invention, the contact area of the outer periphery external terminals on the back surface of the wiring substrate can be increased without widening the adjoining spacing of the external terminals. As a result, the connection strength of the external terminals and the wiring substrate of the semiconductor device can be improved without enlarging the top plan size of the semiconductor device.

(2) Because of effect (1), it is possible to reduce the percentage of defectives to a bend or shock.

What is claimed is:

1. A semiconductor device comprising:

(1) a rectangular wiring substrate having a main surface and a back surface opposite of said main surface, said wiring substrate including: a plurality of first electrodes formed over said main surface; a plurality of second electrodes formed over said back surface; and a plurality of wiring layers for connecting said plurality of first electrodes and said plurality of second electrodes electrically; and (2) a semiconductor chip mounted over the main surface of said wiring substrate, said semiconductor chip including an integrated circuit and a plurality of bonding pads formed on said main surface, said plurality of bonding pads being electrically connected with said plurality of first electrodes of said wiring substrate, wherein said plurality of second electrodes are arrayed along the four sides of said wiring substrate and have a top plan pattern in which the size in the direction to intersect the four sides of said wiring substrate individually is larger than that in the direction in parallel with the four sides of said wiring substrate individually;

wherein each of said plurality of second electrodes includes a first projection electrode;

wherein said first projection electrodes have a top plan pattern in which the size in the direction to intersect the four sides of said wiring substrate individually is larger than that in the direction in parallel with the four sides of said wiring substrate individually;

wherein said semiconductor chip is mounted such that its main surface confronts the main surface of said wiring substrate; and wherein the plurality of bonding pads of said semiconductor chip are electrically connected with the plurality of first electrodes of said wiring substrate through a plurality of second projection electrodes.

2. A semiconductor device according to claim 1, further comprising: third projection electrodes arranged on the back surface of said wiring substrate and at four corners, wherein each of said third projection electrodes has a larger area than that of each of said second projection electrodes.

3. A semiconductor device according to claim 1, further comprising: a plurality of fourth projection electrodes arranged on the back surface of said wiring substrate, wherein said plurality of fourth projection electrodes are arranged along said plurality of first projection electrodes and arrayed inside of said plurality of first projection electrodes.

4. A semiconductor device according to claim 3, wherein said first plurality of projection electrodes are external terminals for high-frequency signals whereas said plurality of fourth projection electrodes are external terminals for a power source.

5. A semiconductor device according to claim 4, wherein said plurality of first projection electrodes individually have an elliptical shape.

6. A semiconductor device according to claim 5, further comprising:

a resin member injected into the clearance between the main surface of said wiring substrate and the main surface of said semiconductor chip, wherein said resin member seals up the clearances between said second projection electrodes and the main surface of said semiconductor chip.

7. A semiconductor device according to claim 6, further comprising:

a plurality of through holes extending from the back surface to the main surface of said wiring substrate for connecting said plurality of second electrodes and said plurality of first electrodes individually electrically, wherein said plurality of through holes are arranged to overlie said plurality of second electrodes, as viewed in the top plan, wherein said plurality of through holes include first through holes and second through holes formed at the positions of the second electrodes which are arranged adjacent to said second electrodes where said first through holes are formed, and wherein said first through holes are arranged individually adjacent to the four sides of said wiring substrate whereas said second through holes are arranged at positions farther from the individual four sides of said wiring substrate than said first through holes.

8. A semiconductor device according to claim 7, wherein the plurality of wiring layers of said wiring substrate include first signal wiring lines and second signal wiring lines formed over the main surface of said wiring substrate and are individually connected at their one-ends with said plurality of first electrodes, and wherein the other ends of said first signal wiring lines and said second signal wiring lines are individually connected on the main surface side of said wiring substrate with said first through holes and said second through holes.

* * * * *